US010775669B2

(12) United States Patent
Imada et al.

(10) Patent No.: US 10,775,669 B2
(45) Date of Patent: Sep. 15, 2020

(54) LIGHT EMITTING MODULE

(71) Applicant: NICHIA CORPORATION, Anan-shi, Tokushima (JP)

(72) Inventors: Mamoru Imada, Anan (JP); Toshiaki Moriwaki, Itano-gun (JP); Yusaku Achi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/365,037

(22) Filed: Mar. 26, 2019

(65) Prior Publication Data

US 2019/0294005 A1 Sep. 26, 2019

(30) Foreign Application Priority Data

Mar. 26, 2018 (JP) ................................ 2018-059065
Mar. 25, 2019 (JP) ................................ 2019-056066

(51) Int. Cl.
*G02F 1/13357* (2006.01)
*F21V 8/00* (2006.01)
(Continued)

(52) U.S. Cl.
CPC .......... *G02F 1/133611* (2013.01); *G02B 6/00* (2013.01); *G02B 6/0021* (2013.01); *G02B 6/0025* (2013.01); *G02B 6/0026* (2013.01); *G02F 1/133603* (2013.01); *G02F 1/133606* (2013.01); *H01L 25/0753* (2013.01); *H01L 33/52* (2013.01); *G02F 2001/133614* (2013.01);
(Continued)

(58) Field of Classification Search
None
See application file for complete search history.

(56) References Cited

U.S. PATENT DOCUMENTS

2001/0028053 A1* 10/2001 Hohn ................ C09K 11/7718 252/301.36
2002/0063520 A1* 5/2002 Yu ........................ H01L 33/505 313/512

(Continued)

FOREIGN PATENT DOCUMENTS

JP 2007018936 A 1/2007
JP 2007188863 A 7/2007

(Continued)

*Primary Examiner* — Britt D Hanley
(74) *Attorney, Agent, or Firm* — Hunton Andrews Kurth LLP

(57) ABSTRACT

A light emitting module includes a light transmissive light guiding plate, a light adjustment portion, and a light emitting element. The light guiding plate has a first main surface serving as a light emitting surface which emits light outside, and a second main surface opposite to the first main surface. The second main surface is provided with a recess. The light adjustment portion is disposed in the recess of the light guiding plate. The light emitting element is bonded to the light adjustment portion. The light adjustment portion includes a wavelength conversion portion and a light diffusion portion. The light diffusion portion has a wavelength conversion portion side on which the wavelength conversion portion is bonded. The light diffusion portion is disposed on a bottom of the recess. The wavelength conversion portion is bonded to the light emitting element.

14 Claims, 22 Drawing Sheets

(51) Int. Cl.

| | |
|---|---|
| ***H01L 33/52*** | (2010.01) |
| ***H01L 25/075*** | (2006.01) |
| ***G02B 6/00*** | (2006.01) |
| ***H01L 33/50*** | (2010.01) |
| ***H01L 33/58*** | (2010.01) |

(52) U.S. Cl.

CPC ............ *H01L 33/505* (2013.01); *H01L 33/58* (2013.01); *H01L 2933/0091* (2013.01)

(56) References Cited

U.S. PATENT DOCUMENTS

| | | | |
|---|---|---|---|
| 2007/0085105 | A1 | 4/2007 | Beeson et al. |
| 2007/0147073 | A1 | 6/2007 | Sakai et al. |
| 2009/0086508 | A1 | 4/2009 | Bierhuizen |
| 2011/0149594 | A1 | 6/2011 | Terajima et al. |
| 2013/0039617 | A1 | 2/2013 | Illek et al. |
| 2015/0036317 | A1 | 2/2015 | Yamamoto et al. |
| 2015/0097198 | A1 | 4/2015 | Illek et al. |
| 2018/0095329 | A1 | 4/2018 | Shimizu |

FOREIGN PATENT DOCUMENTS

| | | | |
|---|---|---|---|
| JP | 2007227286 | A | 9/2007 |
| JP | 2008205401 | A | 9/2008 |
| JP | 2010008837 | A | 1/2010 |
| JP | 2011210674 | A | 10/2011 |
| JP | 2015032373 | A | 2/2015 |
| JP | 2016115703 | A | 6/2016 |
| WO | 2012141094 | A1 | 10/2012 |
| WO | 2016/171109 | A1 | 10/2016 |

* cited by examiner 100A
(100)
(3)3A
1a
1e
1
1d
1c
3A
24
15A
15B
15
18
16B
11b
11
11d
11c
1b
19(14)
12
13
10
17

100'
5
1'
1b
3
1f
5
1f
1b
1'
3
5
5

100C
(100)
11
1a
1e
1
1d
1c
24
16B
11b
11
11d
11c
1b
12
13
10
15

100D(100)
1b
19(14)
18
24
3A(3)
11b
16B
11d
13a
11b
24
15A
15
15B
13
12
10
17
12a
11c
1a

LIGHT EMITTING MODULE

CROSS-REFERENCE TO RELATED APPLICATION

This application claims priority to Japanese Patent Application No. 2018-059065 filed on Mar. 26, 2018, and Japanese Patent Application No. 2019-056066, filed on Mar. 25, 2019, the disclosures of which are hereby incorporated by reference in their entirety.

BACKGROUND

1. Field of the Invention

The present disclosure relates to a light emitting module.

Light emitting devices using light emitting elements such as light emitting diodes are widely used as light sources of backlights for liquid crystal displays, and various light sources for displays.

For example, a light source device as disclosed in Japanese Patent Publication No. 2015-32373A includes a plurality of light emitting elements mounted on a mounting substrate, hemispherical lens members encapsulating the light emitting elements, and a light diffusion member to which light from the light emitting elements enters, the light diffusion member being disposed on the hemispherical lens member.

Further, in a light source device as disclosed in Japanese Patent Publication No. 2016-115703, a two-layer sheet obtained by integrating an encapsulating resin layer with a fluorescent material layer is bonded to the upper surface of a light emitting element, and the lateral surface of the light emitting element is covered with a reflecting resin.

However, in the light source device disclosed in JP2015-32373A, the distance between the mounting substrate and the diffusion plate should be greater than the thickness of the lens member, so that there is a possibility to fail sufficient thickness reduction. In addition, the light source device in JP2016-115703A cannot uniformly disperse and irradiate light from a plurality of light emitting elements, and thus cannot be used in applications which require light emission characteristics with little luminance non-uniformity.

The present disclosure is intended to provide a light emitting module capable of achieving uniform light emission characteristics with little luminance non-uniformity while having reduced thickness.

SUMMARY

A light emitting module according to the present disclosure includes a light transmissive light guiding plate, a light adjustment portion, and a light emitting element. The light guiding plate has a first main surface serving as a light emitting surface which emits light outside, and a second main surface opposite to the first main surface. The second main surface is provided with a recess. The light adjustment portion is disposed in the recess of the light guiding plate. The light emitting element is bonded to the light adjustment portion. The light adjustment portion includes a wavelength conversion portion and a light diffusion portion. The light diffusion portion has a wavelength conversion portion side on which the wavelength conversion portion is bonded. The light diffusion portion is disposed on a bottom of the recess. The wavelength conversion portion is bonded to the light emitting element.

The light emitting module according to the present disclosure has such a feature that the light diffusion portion is provided in the recess of the light guiding plate, and the light emitting element is bonded to the light diffusion portion with the wavelength conversion portion interposed therebetween Accordingly, luminance non-uniformity of light exiting outside from the light guiding plate is reduced, to thereby achieve uniform light emission characteristics while the total thickness is reduced.

DETAILED DESCRIPTION OF EMBODIMENTS

Figure 1:
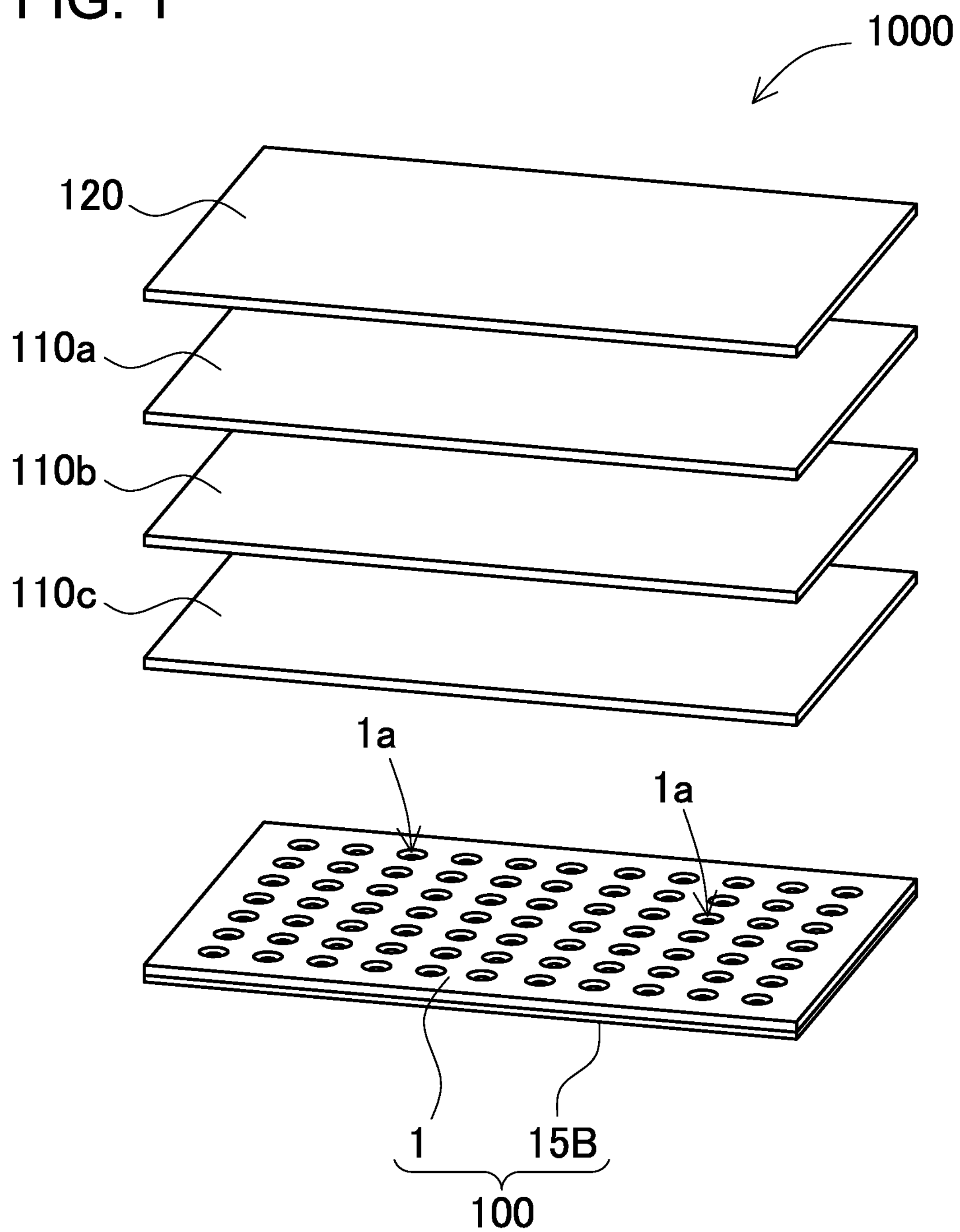
FIG. 1 is a block diagram showing a configuration of each part of a liquid crystal display device according to certain embodiment.

Hereinafter, the present disclosure will be described in detail with reference to the drawings. In the following descriptions, terms showing a specific direction or position (e.g. "upper", "lower" and other terms relating to such terms) are used as necessary, but these terms are used for ease of understanding of the disclosure by referring to the drawings, and the meaning of these terms does not limit the technical scope of the present disclosure. In the following description, in principle, identical name and reference character denote an identical or similar member.

Further, embodiments described below are intended to give an example of a light emitting module for embodying the technical idea of the present disclosure, and do not limit the present disclosure to the following embodiments. In addition, unless otherwise specified, the dimensions, materials, shapes, relative arrangements and so on of components described below are not intended to limit the scope of the present disclosure thereto, but are intended to give an example. In addition, details described in certain embodiment or example is also applicable to other embodiments or examples. In addition, the sizes, positional relations and so on of members shown in the drawings may be exaggerated for clarification of explanation.

Liquid Crystal Display Device 1000

FIG. 1 is a block diagram showing a configuration a liquid crystal display device 1000 including a light emitting module according to an embodiment. The liquid crystal display device 1000 shown in FIG. 1 includes a liquid crystal panel 120, two pieces of lens sheets 110*a* and 110*b*, a diffusion sheet 110*c* and a light emitting module 100. The liquid crystal display device 1000 shown in FIG. 1 is a so-called direct backlighting liquid crystal display device in which the light emitting module 100 is stacked under the liquid crystal panel 120. The liquid crystal display device 1000 irradiates the liquid crystal panel 120 with light emitted from the light emitting module 100. In addition to the above-described constituent members, members such as a polarizing film and a color filter may be provided.

Light Emitting Module 100

Figure 2:
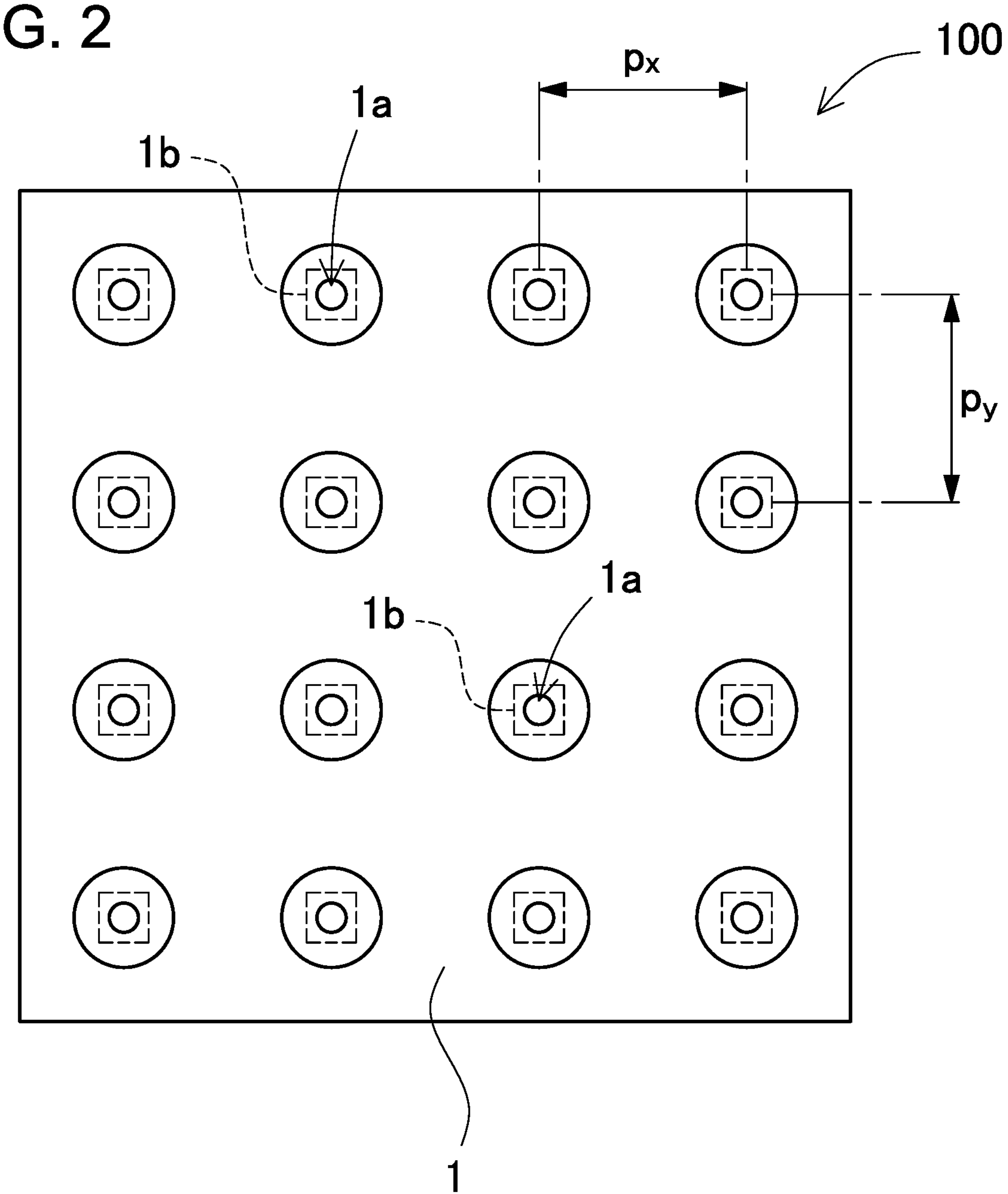
FIG. 2 is a schematic plan view of a light emitting module according to certain embodiment.
Figure 3:
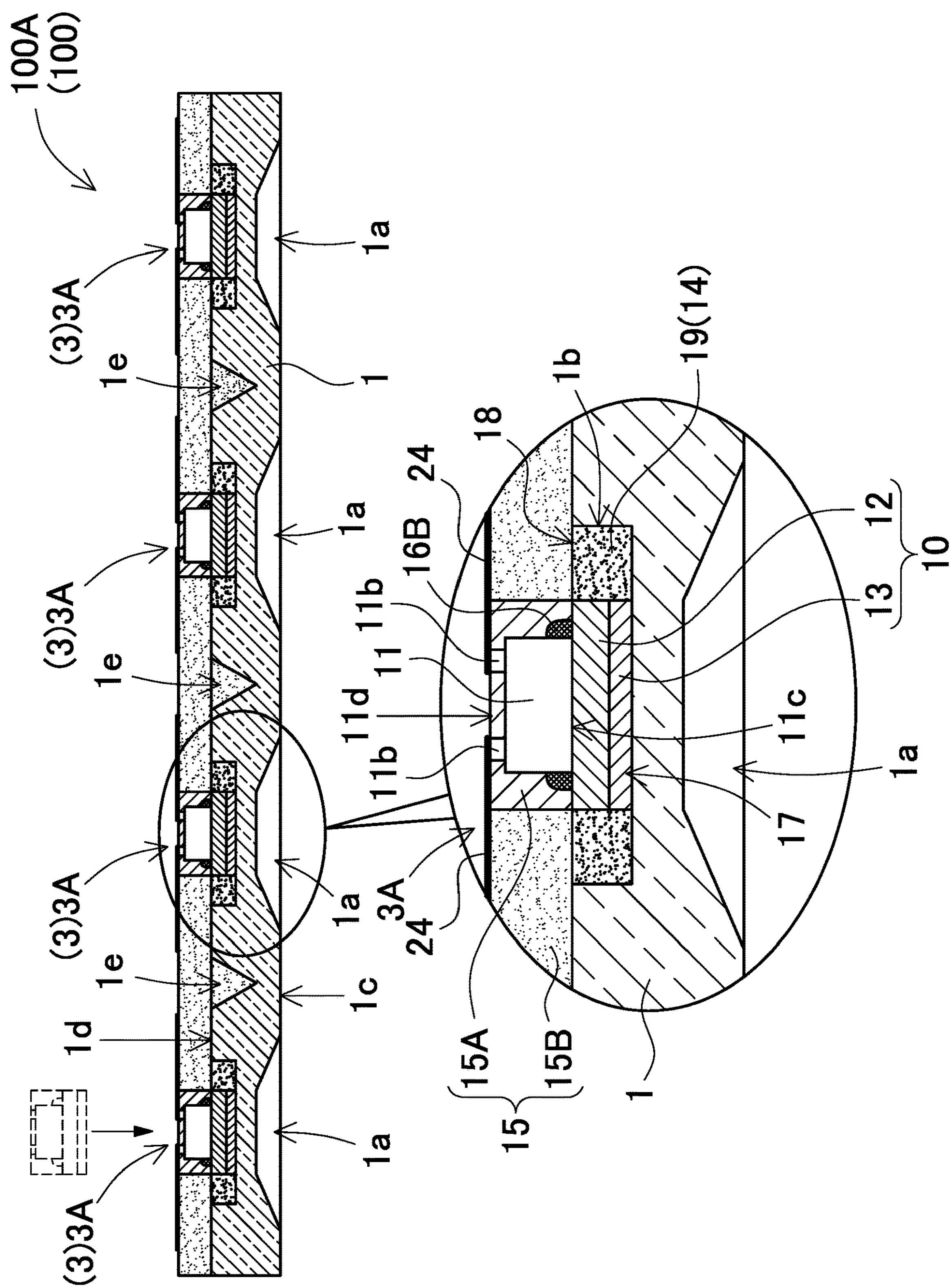
FIG. 3 is a partially enlarged schematic sectional view of the light emitting module according to the embodiment, where the light emitting module is upside down with a light guiding plate positioned on the lower side.

FIGS. 2 and 3 show a configuration of a light emitting module of an embodiment according to the present disclosure. FIG. 2 is a schematic plan view of the light emitting module according to this embodiment. FIG. 3 is a partially enlarged schematic sectional view showing the light emitting module according to this embodiment, where the light emitting module is upside down with a light guiding plate positioned on the lower side. In the light emitting module 100 shown in these drawings, a plurality of recesses 1*b* is provided on one light guiding plate 1, and light emitting elements 11 are arranged in such a manner as to respectively correspond to the recesses 1*b*. However, the light emitting module may have a configuration of a light emitting module 100' as shown in a schematic bottom view of FIG. 4, in which one recess 1*b* is formed on a light guiding plate 1', the light emitting element 11 is disposed in the recess 1*b* to form a light emitting bit 5, and a plurality of light emitting bits 5 is arranged.

The light emitting module 100 shown in FIG. 3 includes the light guiding plate 1, a light diffusion portion 13 provided in the recess 1*b* of the light guiding plate 1, a wavelength conversion portion 12 stacked on the light diffusion portion 13, and the light emitting element 11 bonded to a surface of the wavelength conversion portion 12. A light emitting module 100A shown in FIG. 3 is formed by bonding the light guiding plate 1 to a light emitting element unit 3A having as an integral structure of the light emitting element 11 and a light adjustment portion 10 in which the wavelength conversion portion 12 and the light diffusion portion 13 are stacked. Further, the light emitting element unit 3A of the light emitting module 100A shown in FIG. 3 includes a first encapsulating resin 15A for embedding the light emitting element 11, and the outer lateral surfaces of the first encapsulating resin 15A flush with the outer lateral surfaces of the light adjustment portion 10. Further, in the light emitting module 100A, a second encapsulating resin 15B for embedding the light emitting element unit 3A is provided on a second main surface 1*d* of the light guiding plate 1 to which the light emitting element unit 3A is bonded. Hereinafter, as shown in FIG. 3, the light emitting module 100A will be described in detail in which the light emitting element unit 3A is bonded to the recess 1*b* of the light guiding plate 1, the light emitting element unit 3A having as an integral structure of the light emitting element 11 and the light adjustment portion 10 in which the wavelength conversion portion 12 and the light diffusion portion 13 are stacked.

In the light emitting element unit 3A shown in FIG. 3, the light emitting element 11 is bonded to a surface of the light adjustment portion 10 in which the wavelength conversion portion 12 and the light diffusion portion 13 are stacked. The light emitting element 11 has an upper surface as an electrode-formed surface 11*d* and a lower surface as a light emission surface 11*c*. The light emitting element 11 irradiates the wavelength conversion portion 12 by radiating light mainly from the light emission surface 11*c*. In the light emitting module 100A shown in FIGS. 2 and 3, more than one of the light emitting element units 3A is arranged in recesses 1*b* provided in a matrix form on the light guiding plate 1, so that the light emitting element units 3A are bonded to the light guiding plate 1. The light guiding plate 1 has a first main surface 1*c* and a second main surface 1*d*, the first main surface 1*c* serving as a light emitting surface that radiates light outside, the second main surface 1*d* being provided with more than one of recesses 1*b*. In each of the recesses 1*b*, a part of the light emitting element unit 3A, in other words, the light adjustment portion 10 with the wavelength conversion portion 12 stacked on the light diffusion portion 13 is positioned as shown in FIG. 3. The light adjustment portion 10 includes the wavelength conversion portion 12 bonded to a surface close to the light emitting element 11, and the light diffusion portion 13 bonded to the bottom side of the recess 1*b* of the light guiding plate 1. In the light adjustment portion 10, light transmitted through the wavelength conversion portion 12 is diffused by the light diffusion portion 13, and irradiate to the light guiding plate 1, so that light exiting from the light guiding plate 1 can be more uniform.

The light emitting module 100 according to the present disclosure can have a reduced thickness as a whole because the recess 1*b* is provided on the light guiding plate 1, and the light adjustment portion 10 of the light emitting element unit 3 is disposed in the recess 1*b*. In addition, the recess 1*b* is provided on the light guiding plate 1, and the light adjustment portion 10 of the light emitting element unit 3 is disposed in the recess 1*b*. Thus positional deviation between the light emitting element unit 3 and the light guiding plate 1 can be more reliably prevented or alleviated as compared to a light emitting module in which a light emitting element is mounted on a substrate, and light guiding plates are combined. Further, the light emitting module 100 in which the light emitting element unit 3 including the light emitting element 11 and the wavelength conversion portion 12 integrally disposed in the recess 1*b* of the light guiding plate 1 can achieve desirable optical characteristics by accurately disposing both the wavelength conversion portion 12 and the light emitting element 11 at predetermined positions on the light guiding plate 1. In particular, the light emitting module 100 in which light from the light emitting element 11 is transmitted through the wavelength conversion portion 12, guided to the light guiding plate 1, and exits outside can realize mounting with less positional deviation of the light emitting element 11, the wavelength conversion portion 12 and the light guiding plate 1. This can improve light emission characteristics in relation to, for example, color non-uniformity and luminance non-uniformity of light exiting outside from the light guiding plate 1, to thereby achieve good light emission characteristics.

In a direct backlighting of liquid crystal display device, the distance between a liquid crystal panel and a light emitting module is small, and therefore color non-uniformity and luminance non-uniformity of the light emitting module may cause color non-uniformity and luminance non-uniformity of the liquid crystal display device. Thus, a light emitting module with little color non-uniformity and luminance non-uniformity is desired as a light emitting module for a direct backlighting liquid crystal display device.

Employing the configuration of the light emitting module 100 of this embodiment can reduce luminance non-uniformity and color non-uniformity while reducing the thickness of the light emitting module 100 to 5 mm or less, 3 mm or less, 1 mm or less or the like.

Members that form the light emitting module 100 according to this embodiment, and methods of manufacturing the members will be described in detail below.

Light Guiding Plate 1

Figure 4:
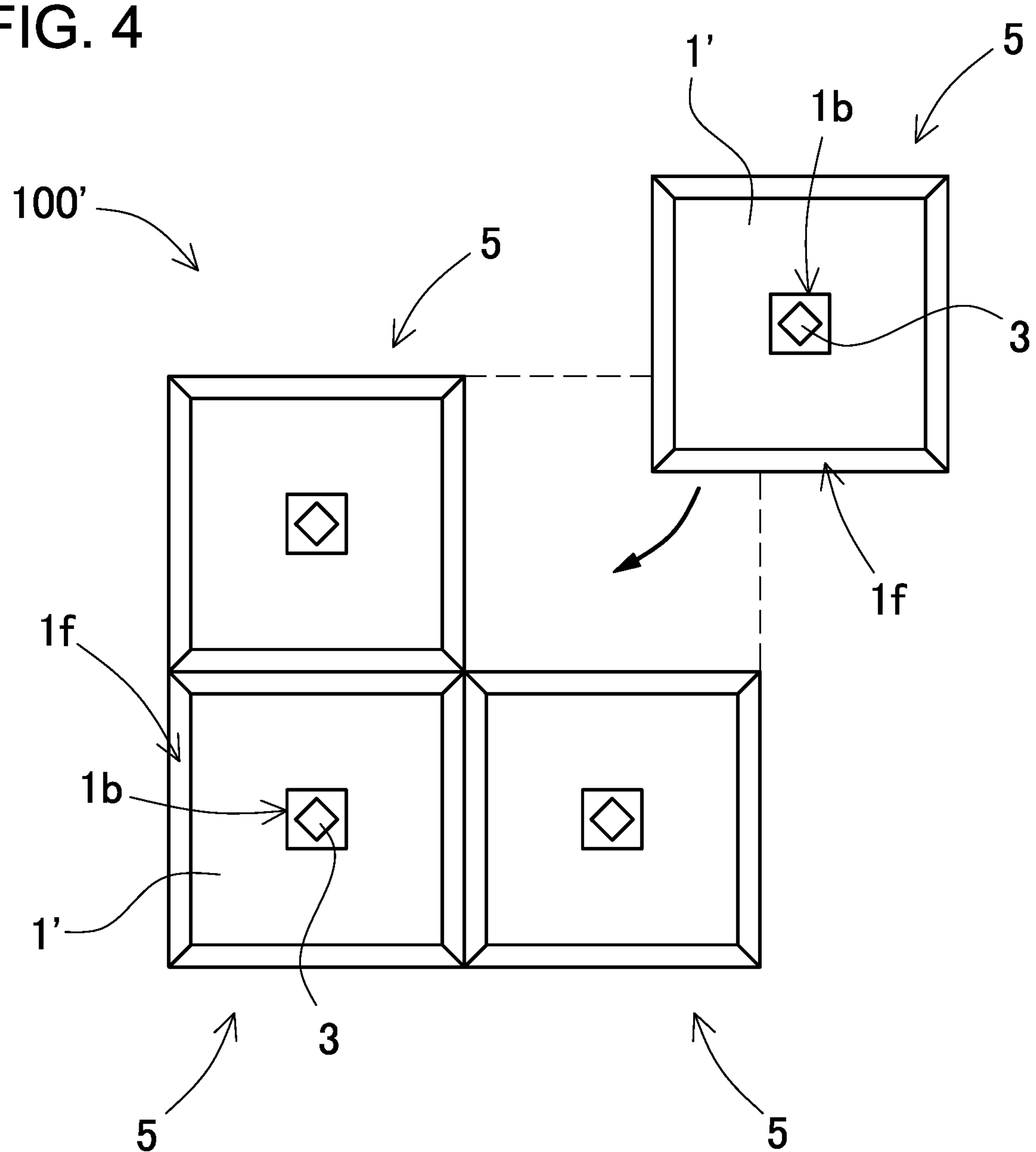
FIG. 4 is a schematic bottom view of a light emitting module according to a second embodiment.

The light guiding plate 1 is a light-transmissive member in which light incident from a light source is formed into a planar shape, and exits outside. As shown in FIG. 2, the light guiding plate 1 in this embodiment has a first main surface 1*c* as a light emitting surface, and a second main surface 1*d* disposed on a side opposite to the first main surface 1*c*. The light guiding plate 1 is provided with a plurality of recesses 1*b* formed on the second main surface 1*d* and a V-shaped groove 1*e* provided between adjacent recesses 1*b*. A part of the light emitting element unit 3 is positioned in the recess 1*b*. Inserting a part of the light emitting element 11 into the recess 1*b* of the light guiding plate 1 can reduce the thickness of the light emitting module as a whole. The light guiding plate 1 is provide with a plurality of recesses 1*b*, and the light emitting element unit 3*s* are respectively disposed in the recesses 1*b* to form the light emitting module 100 as shown in FIGS. 2 and 3, or one light emitting element unit 3 is disposed on the light guiding plate 1' with one recess 1*b* to form the light emitting bit 5, and a plurality of light emitting bits 5 is arranged on a plane to form the light emitting module 100' as shown in FIG. 4. In the light guiding plate 1 provided with a plurality of recesses 1*b*, at least one grid-like V-shaped groove 1*e* is formed between recesses 1*b* as shown in FIG. 3. The light guiding plate 1 provided with one recess 1*b* has an inclined surface 1*f* inclined downward toward the outer peripheral edge on an outer peripheral portion of the second main surface 1*d* as shown in FIG. 4.

The V-shaped groove 1*e* and the inclined surface 1*f* are provided with a encapsulating resin 15 which reflects light as described later. The encapsulating resin 15 supplied in the V-shaped groove 1*e* is preferably formed using a white resin which reflects light, and the encapsulating resin 15 of white resin can alleviate incidence of light emitted from the light emitting element 11 to a neighboring light guiding plate 2 sectioned by the V-shaped groove 1*e*, so that light from each light emitting element 11 is less likely to leak to a neighbor. The encapsulating resin 15 bonded to the inclined surface 1*f* provided on an outer peripheral portion of the second main surface 1*d* of one light guiding plate 1 can alleviate leakage of light to the periphery of the light guiding plate 1, to thereby alleviate an intensity decrease of light emitted from the first main surface 1*c* of the light guiding plate 1.

The size of the light guiding plate 1 is appropriately determined according to the number of recesses 1*b*, and for example, the light guiding plate 1 with the plurality of recesses 1*b* may have a size in a range of about 1 cm to about 200 cm, preferably about 3 cm to about 30 cm, on each side. The light guiding plate 1 may have a thickness in a range of about 0.1 mm to about 5 mm, preferably about 0.5 mm to about 3 mm. The planar shape of the light guiding plate 1 may be a substantially rectangular shape, a substantially circular shape or the like.

As a material for the light guiding plate 1, optically transparent materials such as resin materials including a thermoplastic resins and thermosetting resins, or glass. Example thermoplastic resins include acrylic, polycarbonate, a cyclic polyolefin, polyethylene terephthalate or polyester. Example thermosetting resins include epoxy or silicone. In particular, thermoplastic resin materials are preferable because they can be efficiently processed by injection molding. In particular, polycarbonate is preferable because it has high transparency and is inexpensive. For a light emitting module which is manufactured without being exposed to a high-temperature environment as in reflow soldering in a manufacturing process, even a thermoplastic material having low heat resistance, such as polycarbonate, can be used.

The light guiding plate 1 can be molded by, for example, injection molding or a transfer mold. The light guiding plate 1 can be formed into a shape having recesses 1*b* by a mold, and mass-produced at low cost while positional deviation of recesses 1*b* is reduced. However, the light guiding plate can also be provided with recesses by cutting processing, for example, with a NC processing machine after being molded into a plate shape.

The light guiding plate 1 in this embodiment may be formed with a single layer, or multilayer formed by stacking a plurality of light-transmissive layers. When employing a multilayered light guiding plate, one or more layers having different refractive indices, for example, a layer of air, is provided between appropriately selected layers. Accordingly, light is more easily diffused, so that a light emitting module with reduced luminance non-uniformity can be obtained. Such a configuration can be obtained by, for example, providing a spacer between appropriately-selected light-transmissive layers to separate the layers, and providing a layer of air. In addition, on the first main surface 1*c* of the light guiding plate 1, a light-transmissive layer, and a layer having a different refractive index, e.g. a layer of air, between the first main surface 1*c* of the light guiding plate 1 and the light-transmissive layer may be provided. Accordingly, light is more easily diffused, so that a liquid crystal display device having reduced luminance non-uniformity can be obtained. Such a configuration can be obtained by, for example, providing a spacer in at least one appropriately-selected layer between the light guiding plate 1 and light-transmissive layer to separate the light guiding plate 1 and the light-transmissive layer, to thereby provide a layer of air.

Optically Functional Portion 1*a*

The light guiding plate 1 may include an optically functional portion 1*a* on the first main surface 1*c* side. The optically functional portion 1*a* can have a function of, for example, spreading light in the surface of the light guiding plate 1. For example, a material different in refractive index from the material of the light guiding plate 1 is provided. Specifically, it is possible to use a recess which is formed on the first main surface 1*c* side, and has an inverted truncated cone shape, an inverted truncated polygonal pyramid shape or the like, or an inverted cone shape, or an inverted polygonal pyramid shape such as an inverted quadrangular pyramid shape or an inverted hexagonal pyramid shape and which reflects irradiated light in a lateral direction of the light emitting element unit 3 at an interface between the inclined surface of the recess and the material different in refractive index from the light guiding plate 1 (e.g. air). In addition, for example, the recess 1*b* having an inclined surface and provided with a light-reflective material (e.g. a reflecting film of metal or the like, or a white resin) or the like may also be used. The inclined surface of the optically functional portion 1*a* may be a straight line or a curved line in sectional view. As described later, the optically functional portion 1*a* is provided at a position corresponding to each light emitting element unit 3, in other words, a position on a side opposite to the light emitting element unit 3 disposed on the second main surface 1*d* side. In particular, the optical axis of the light emitting element unit 3 is preferably substantially coincident with the optical axis of the optically functional portion 1*a*. The size of the optically functional portion 1*a* can be appropriately determined.

Recess 1*b*

The light guiding plate 1 is provided with the recess 1*b* formed on the second main surface 1*d* side. A part of the light emitting element unit 3 is disposed at a predetermine position inside the recess 1*b*. The recess 1*b* shown in FIG. 3 has a shape obtained by cutting off a part of the second main surface 1*d*. The recess can also be provided inside a projection formed in a ring shape on the second main surface (not shown). The inner surface outline of the recess 1*b* has a size larger than that of the outline of an insertion portion 17 for disposing the light emitting element unit 3 in the recess 1*b*, and a ring gap 18 is formed between the inner periphery of the recess 1*b* and the outer periphery of the insertion portion 17 of the light emitting element unit 3 in a state where the insertion portion 17 of the light emitting element unit 3 is disposed. The ring gap 18 is filled with a bonding agent 14 to form a bonding wall 19. The inner surface outline of the recess 1*b* is formed such that the volumetric capacity of the ring gap 18 is larger than the volume of the insertion portion 17 of the light emitting element unit 3. In the light emitting module of this embodiment, the light adjustment portion 10 is disposed in the recess 1*b* of the light guiding plate 1, and therefore the light adjustment portion 10 is used as the insertion portion 17 of the light emitting element unit 3. The insertion portion 17 of the light emitting element unit 3 may be applied as not only the light adjustment portion 10, but also applied as the light adjustment portion 10 and a part of the light emitting element 11 in the recess 1*b*.

The inner surface outline of the recess 1*b* is formed such that the capacity of the ring gap 18 is, for example, not less than 1.2 times, preferably not less than 1.5 times, more preferably not less than 2 times the volume of the insertion portion 17 of the light emitting element unit 3. The ring gap 18 is filled with the bonding agent 14 to form the bonding wall 19. In the light guiding plate 1 shown in FIG. 5, the inner surface outline of the recess 1*b* has a quadrangular shape, and the outline of the insertion portion 17 of the light emitting element unit 3 in the recess 1*b* has a quadrangular shape. The quadrangular insertion portion 17 is disposed in the recess 1*b* with an orientation in which each side crosses the quadrangular recess 1*b*, in other words, an orientation in which the insertion portion is rotated with respect to the quadrangular recess 1*b*, so that the ring gap 18 is provided between the recess 1*b* and the insertion portion 17. The insertion portion 17 in this drawing is positioned in the recess 1*b* with an orientation in which each side is inclined at 45 degrees. The recess 1*b* in which the insertion portion 17 is disposed with this orientation has an inner surface outline having a size at least 2 times the size of the outline of the insertion portion 17.

Figure 5:
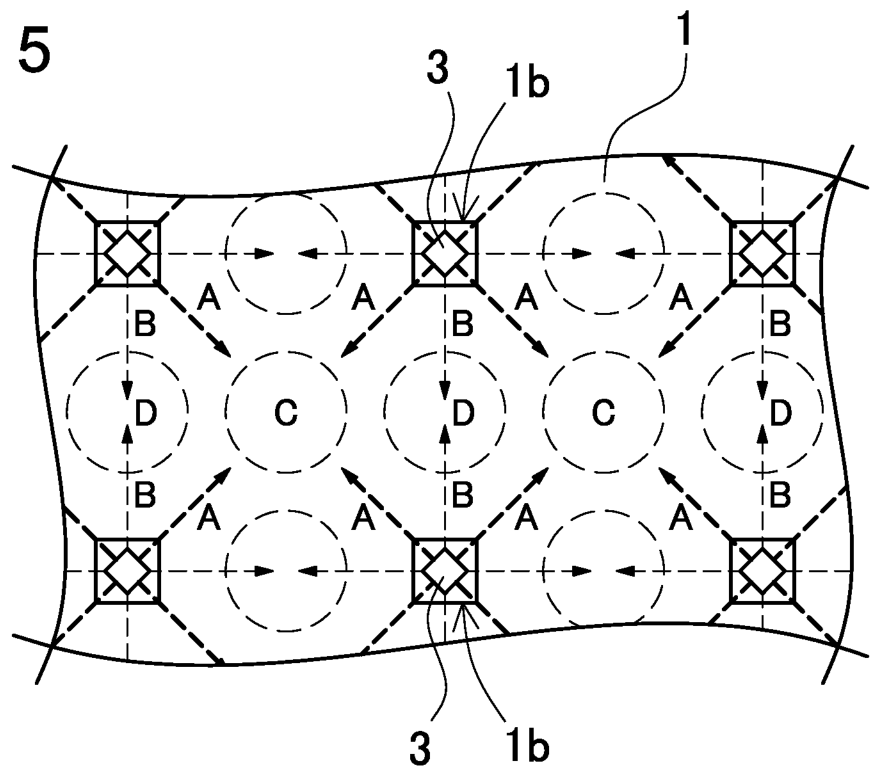
FIG. 5 is a schematic bottom view showing a quadrangular insertion portion formed obliquely with respect to a quadrangular recess.
Figure 6:
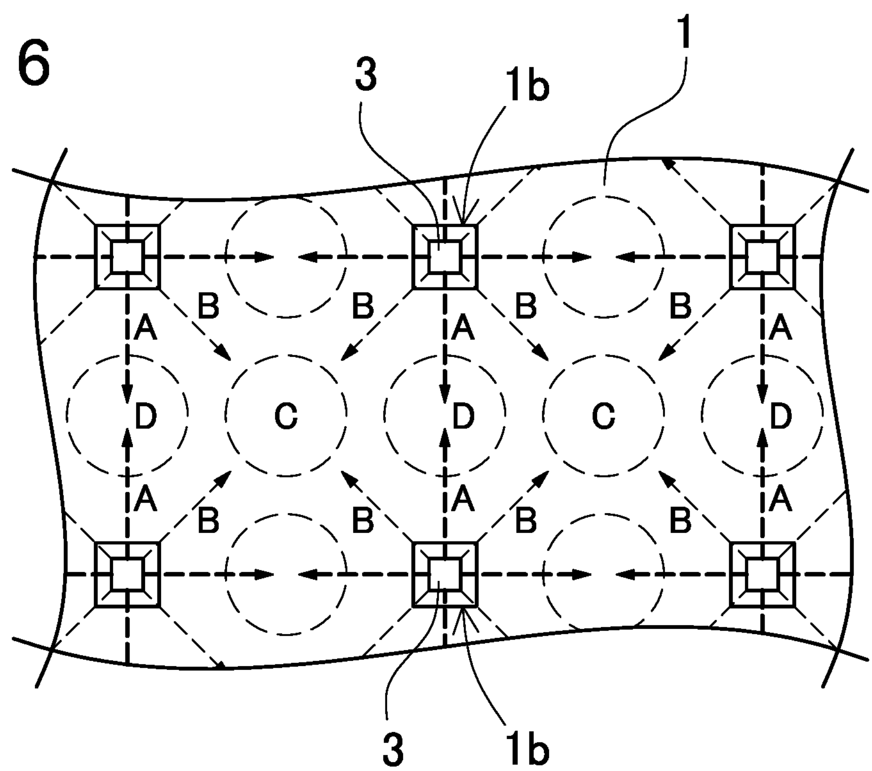
FIG. 6 is a schematic bottom view showing a state in which a quadrangular insertion portion formed parallel with respect to a quadrangular recess.

The light guiding plate 1 with the insertion portion 17 disposed in the recess 1*b* with an orientation shown in FIG. 5 has such a feature that luminance non-uniformity on the first main surface 1*c* can be reduced. This is because light emitted from each lateral surface of the insertion portion 17 to the periphery is intensely radiated in the direction of arrow A shown by a chain line in FIG. 5, so that region C in FIG. 5 is brightly irradiated. In the quadrangular insertion portion 17, the intensity of light in an arrow A direction orthogonally crossing each side is higher than the intensity of light radiated in an arrow B direction from a corner. In FIG. 5, region C is positioned at a greater distance from the insertion portion 17 than region D, and therefore tends to be dark. However, light is more intense in an arrow A direction than in an arrow B direction, thus luminance decrease can be alleviated, resulting in reduction of luminance non-uniformity. When the quadrangular insertion portion 17 is disposed in the quadrangular recess 1*b* with an orientation in which the sides of the insertion portion 17 are parallel to the sides of the recess 1*b* as shown in FIG. 6, region C is positioned at a greater distance from the insertion portion 17 than region D, and the intensity of light radiated from the insertion portion 17 decreases, so that the luminance is lower in region C than the luminance in region D.

Figure 7:
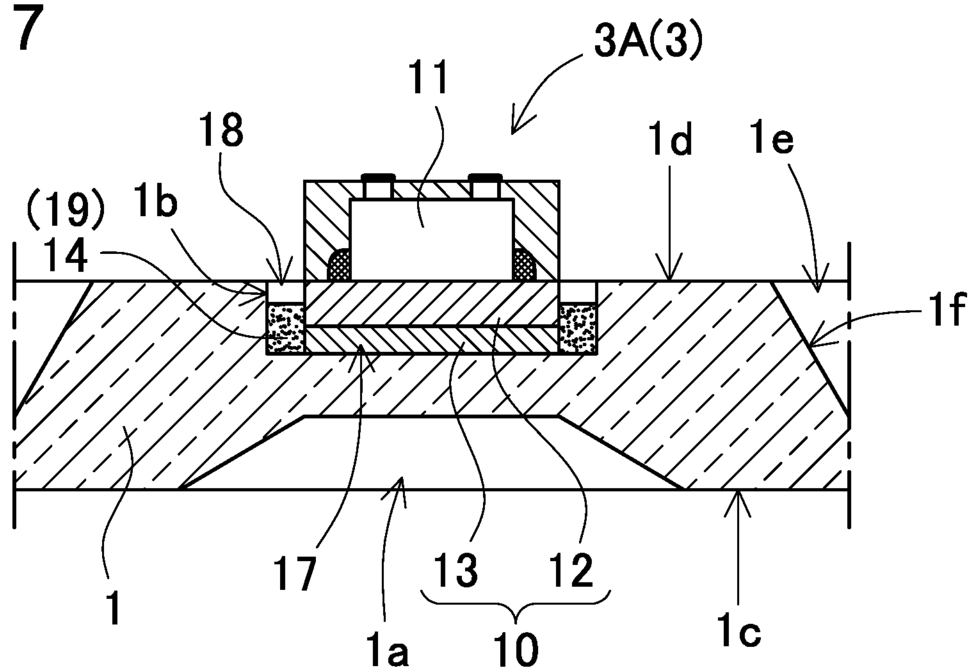
FIG. 7 is a sectional view showing the surface of a bonding wall lowered due to slight difference in supplying amount of a bonding agent.
Figure 8:
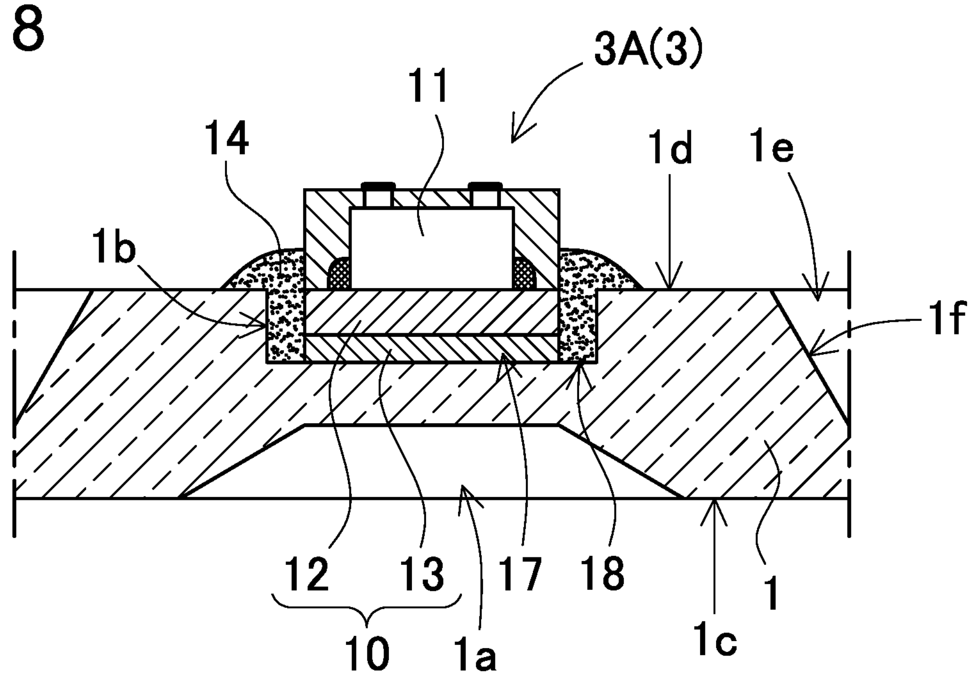
FIG. 8 is a sectional view showing the surface of a bonding wall raised due to slight difference in supplying amount of a bonding agent.

The recess 1*b* having an inner surface outline larger in size than the outline of the insertion portion 17 has such a feature that luminance non-uniformity can be alleviated by increasing flexibility in angle of orientation in which the insertion portion 17 is disposed. This can eliminate surface level difference caused by unevenly supplying the bonding agent 14 in the ring gap 18, so that a preferable light distribution can be achieved at the outer peripheral of the recess 1*b*. The ring gap 18 is filled with the bonding agent 14 to form the light-transmissive bonding wall 19, and supplying uneven amount of the bonding agent 14 makes the surface level uneven, resulting in undesirable light emission. FIGS. 7 and 8 shows a state in which supplying uneven amount of the bonding agent 14 makes the liquid surface level of the bonding wall 19 uneven. FIG. 7 shows a state in which the supplying amount of the bonding agent 14 is excessively small. The surface level of the bonding wall 19 is lower than the second main surface 1*d* of the light guiding plate 1, and decreases to the inside of the ring gap 18, so that an air gap is generated between the light guiding plate 1 and the insertion portion 17. FIG. 8 shows a state in which the supplying amount of the bonding agent 14 is excessively large. In this case, the bonding agent 14 for forming the bonding wall is leaked out from the ring gap 18, and rises on the second main surface 1*d*. The bonding agent 14 put in a gap between the light guiding plate 1 and the insertion portion 17 and rising on the second main surface 1*d* changes a path of light incident to the light guiding plate 1 from the insertion portion 17, resulting in undesirable light emission.

The volumetric capacity of the ring gap 18 can be larger than the volume of the insertion portion 17 by having the inner surface outline of the recess 1*b* larger in size than the insertion portion 17. This structure can reduce level difference of the liquid surface due to variation of supplying amount of the bonding agent 14 in the ring gap 18, so that preferable light emission can be obtained in regions of the light guiding plate 1 and the insertion portion 17.

In consideration of the outline of the insertion portion 17 and the characteristics described above, the size of the recess 1*b* in a plan view may be, for example, 0.05 mm to 10 mm, preferably 0.1 mm to 2 mm, in terms of a diameter in a circular shape, a long diameter in an elliptical shape, and a length of a diagonal in a quadrangular shape. The depth of the recess 1*b* may be 0.05 mm to 4 mm, preferably 0.1 mm to 1 mm. The distance between the optically functional portion 1*a* and the recess 1*b* can be appropriately determined as long as the optically functional portion 1*a* and the recess 1*b* are separated from each other. The shape of the recess 1*b* in a plan view may be, for example, a substantially rectangular shape or a substantially circular shape, and can be selected according to arrangement pitches of recesses 1*b* and the like. The arrangement pitches of the recesses 1*b* (i.e., distances between the centers of two recesses 1*b* closest to each other) are substantially equal, preferable shape of the recess 1*b* in a plan view is a substantially circular shape or a substantially square shape. In particular, the recess 1*b* having a substantially circular shape in a plan view can desirably spread light from the light emitting element unit 3.

Light Emitting Element Unit 3

The light emitting element unit 3 is a light source for the light emitting module 100. In the light emitting element unit 3A, the light adjustment portion 10 in which the light diffusion portion 13 and the wavelength conversion portion 12 are stacked is bonded to the light emitting element 11 as shown in FIG. 3. Further, in the light emitting element unit 3A in this embodiment, the first encapsulating resin 15A for embedding the light emitting element 11 is provided and the outer lateral surfaces of the first encapsulating resin 15A are flush with the outer lateral surfaces of the light adjustment portion 10, and. The light emitting element unit 3A is disposed in the recess 1*b* of the light guiding plate 1 to emit light outside through the light guiding plate 1. The light emitting element unit 3A in the drawing is disposed inside the recess 1*b* as the insertion portion 17 for disposing the light adjustment portion 10 in the recess 1*b* of the light guiding plate 1. The light emitting element unit 3A includes the light adjustment portion 10 bonded to the bottom of the recess 1*b* formed on the light guiding plate 1.

The light emitting element unit 3A shown in FIG. 3 includes the light adjustment portion 10 bonded to the light emission surface 11*c* of the light emitting element 11. In the light emitting element 11, the light adjustment portion 10 is bonded to the light emission surface 11*c* such that a surface opposite to the electrode-formed surface 11*d* serves as the light emission surface 11*c*. In the light emitting module of this embodiment, a facedown type is employed in which the light emission surface 11*c* is positioned opposite to the electrode-formed surface 11*d*, and the light emission surface 11*c* serves as a main light emitting surface, but a light emitting element of faceup type can also be used. In the light emitting element 11 shown in FIG. 3, a surface opposite to the light emission surface 11*c* serves as the electrode-formed surface 11*d*, and the electrode-formed surface 11*d* is provided with a pair of electrodes 11*b*. A pair of electrodes 11*b* is wired and is electrically connected in a structure as described later. The light emitting element unit 3A and the light guiding plate 1 are bonded to each other with the light-transmissive bonding agent 14 formed of a material using a light-transmissive resin.

For example, the light emitting element 11 includes a light-transmissive substrate of sapphire or the like, and a semiconductor layered structure stacked on the light-transmissive substrate. The semiconductor layered structure includes a light emitting layer, and an n-type semiconductor layer and a p-type semiconductor layer. The light emitting layer is interposed between the n-type semiconductor layer and the p-type semiconductor layer. The n-type semiconductor layer and the p-type semiconductor layer are electrically connected to at least one n-side electrode and at least one p-side electrode 11*b*, respectively. In the light emitting element 11, for example, the light-transmissive substrate serving as the light emission surface 11*c* is disposed so as to face the light guiding plate 1, and a pair of electrodes 11*b* is formed on the electrode-formed surface 11*d* positioned opposite to the light emission surface 11*c*.

The vertical, lateral and height dimensions of the light emitting element 11 have no requirement in their sizes, but it is preferable to use the semiconductor light emitting element 11 having each of vertical and lateral dimensions of 1000 μm or less in a plan view, it is more preferable to use the light emitting element 11 having each of vertical and lateral dimensions of 500 μm or less in a plan view, and it is still more preferable to use the light emitting element 11 having each of vertical and lateral dimensions of 200 μm or less in a plan view. Such a light emitting element 11 can realize a high-definition image at the time of local dimming of the liquid crystal display device 1000. When the light emitting element 11 has vertical and lateral dimensions of 500 μm or less, the light emitting element 11 can be provided at low cost, and therefore the cost of the light emitting module 100 can be reduced. When the light emitting element 11 has vertical and lateral dimensions of 250 μm or less, the upper surface of the light emitting element 11 has a small surface area, and therefore the amount of light emitted from the lateral surface of the light emitting element 11 is relatively large. That is, such a light emitting element 11 tends to emit light in a batwing shape, and is therefore preferably used for the light emitting module 100 of this embodiment in which the light emitting element 11 is bonded to the light guiding plate 1, and a distance between the light emitting element 11 and the light guiding plate 1 is short.

Further, the light guiding plate 1 can be provided with the optically functional portion 1*a* having reflection and diffusion functions, such as a lens. The light guiding plate 1 can laterally spread light from the light emitting element 11 to uniform the light emission intensity in the surface of the light guiding plate 1. However, in the light guiding plate 1 with a plurality of optically functional portions 1*a* formed at the corresponding positions of a plurality of light emitting elements 11, it may be difficult to maintain corresponding positions of all the light emitting elements 11 and optically functional portions 1*a* accurately. Particularly, in the case of a structure in which a large number of small light emitting elements 11 are provided, it is difficult to maintain corresponding positions of all the light emitting elements 11 and optically functional portions 1*a* accurately. Deviation of corresponding positions of the light emitting element 11 and the optionally functional portion 1*a* weakens the function of the optically functional portion 1*a* to sufficiently spread light. Thus brightness on the surface is partially reduced, thereby leading to non-uniformity in luminance. Particularly, in a method including combining light guiding plates 1 to a wiring substrate after mounting the light emitting element 11 on the wiring substrate, it is necessary to give consideration to each of positional deviation of the wiring substrate and the light emitting elements 11 and positional deviation of the light guiding plate 1 from the optically functional portions 1*a* in a planar direction and a stacking direction. Thus there is a possibility that optical axis of the light emitting element 11 and optical axis of the optically functional portion 1*a* are less likely to be coincide with each other.

The light emitting module 100 in this embodiment has a structure in which the recesses 1*b* and the optically functional portions 1*a* are provided on the light guiding plate 1, and the light emitting element units 3 are respectively disposed in the recesses 1*b*, so that both the light emitting elements 11 and the optically functional portions 1*a* can respectively be disposed with high accuracy. Accordingly, light from the light emitting element 11 can be made uniform accurately by the optically functional portion 1*a* to obtain a high-quality light source for backlight with little luminance non-uniformity and color non-uniformity.

In the light guiding plate 1 with the optically functional portion 1*a* provided on a surface opposite to the recess 1*b* in which the light emitting element 11 is disposed, the optically functional portion 1*a* is provided at the position of the recess 1*b* in which the light emitting element 11 is disposed in a plan view, so that positioning of the light emitting element 11 and the optically functional portion 1*a* can be further facilitated to dispose both the light emitting element 11 and the optical functional portion 1*a* with substantially no relative position displacement.

As the light emitting element 11, the rectangular light emitting element 11 having a square shape or oblong shape in a plan view is used. For the light emitting element 11 to be used for a high-definition liquid crystal display device, it is preferable that an oblong light emitting element is used, and the shape of the upper surface of the light emitting element has a long side and a short side. In the case of a high-definition liquid crystal display device, the number of light emitting elements to be used is several thousands or more, and a light emitting element mounting step is an important step. Even if a rotational shift (e.g. a shift in a direction of ±90 degrees) occurs in some of the light emitting elements in the light emitting element mounting step, the shift is easily visually observed when light emitting elements having an oblong shape in a plan view are used. In addition, a p-type electrode and an n-type electrode can be formed at a distance from each other, and therefore wiring 21 as described later can be easily formed. On the other hand, when light emitting elements 11 having a square shape in a plan view are used, small light emitting elements 11 can be manufactured with high mass productivity. The density (i.e., arrangement pitch) of light emitting elements 11, in other words, the interval between light emitting elements 11 may be, for example, in a range of about 0.05 mm to 20 mm, preferably about 1 mm to 10 mm.

In the light emitting module 100A with a plurality of light emitting element units 3 disposed on the light guiding plate 1 provided with a plurality of recesses 1*b*, light emitting element units 3 are two-dimensionally arranged in a plan view of the light guiding plate 1. Preferably, the plurality of light emitting element units 3 is provided in recesses 1*b* which are tow-dimensionally arranged along two orthogonal directions, in other words, the x-direction and the y-direction as shown in FIG. 2. The x-direction arrangement pitch $p_x$ and the y-direction arrangement pitch $p_y$ of recesses 1*b* in which the plurality of light emitting element units 3 is disposed may be equal between the x-direction and the y-direction as shown in the example in FIG. 2, or may be different between the x-direction and the y-direction. In addition, the two directions of arrangement are not necessarily perpendicular to each other. In addition, x-direction or y-direction arrangement pitches are not necessarily equal, and may be unequal. For example, recesses 1*b* in which light emitting element units 3 are disposed may be arranged such that the lengths of respective intervals increase as approaching toward the outer edge from the center of the light guiding plate 1. The pitch between light emitting element units 3 disposed in recesses 1*b* is a distance between the optical axes, in other words, the centers, of light emitting element units 3.

For the light emitting element 11, a known semiconductor light emitting element can be used. In this embodiment, the light emitting element 11 is exemplary explained as a facedown type light emitting diode. The light emitting element 11 emits, for example, blue light. For the light emitting element 11, an element which emits light other than blue light can also be used, and, a faceup type light emitting element can also be used. A plurality of light emitting elements respectively emit light of different colors may be used as the light emitting element 11. Light emitted from the light emitting element 11 is adjusted its color at the wavelength conversion portion 12 before exiting outside.

As the light emitting element 11, an element which emits light having a certain wavelength can be selected. For example, as an element which emits blue or green light, a light emitting element using a nitride-based semiconductor ($In_xAl_yGa_{1-x-y}N$, $0 \leq X$, $0 \leq Y$, $X+Y \leq 1$) or GaP can be used. As an element which emits red light, a light emitting element including a semiconductor such as GaAlAs or AlInGaP can be used. Further, semiconductor light emitting elements composed of materials other than those described above can also be used. A light emission wavelength can be variously selected according to the material of a semiconductor layer and the degree of mixed crystal degree thereof. The composition, color of light emission, size and number of light emitting elements to be used may be appropriately selected according to a purpose.

Light Adjustment Portion 10

In this embodiment, the light emitting element unit 3A is provided with the light adjustment portion 10 in which the color of light emitted from the light emitting element 11 is adjusted before the light enters into the light guiding plate 1. In the light adjustment portion 10, the light diffusion portion 13 for diffusing light is stacked on the wavelength conversion portion 12 for adjusting the color of light emitted from the light emitting element 11. The wavelength conversion portion 12 is bonded to the light emission surface 11*c* of the light emitting element 11 to adjust the color of light emitted from the light emitting element 11. In the light diffusion portion 13, light emitted from the light emitting element 11 is diffused before the light enters into the light guiding plate 1. In the light adjustment portion 10 with the wavelength conversion portion 12 bonded to the light diffusion portion 13, the wavelength conversion portion 12 is disposed on the light emitting element 11 side, and the light diffusion portion is disposed on the bottom of the recess 1*b*. The light adjustment portion 10 can be configured with multilayers of wavelength conversion portions 12 and light diffusion portions 13. In the light emitting module 100A of this embodiment, the light adjustment portion 10 is disposed in the recess 1*b* of the light guiding plate 1, and used as the insertion portion 17 for the light emitting element unit 3A. The light adjustment portion 10 transmits light entering from the light emitting element 11 before the light enters into the light guiding plate 1. For the purpose of, for example, thinning the light emitting module 100A, the light adjustment portion 10 is positioned inside the recess 1*b* of the light guiding plate 1, and disposed in the recess 1*b* without protruding from a plane flush with the second main surface 1*d*, as shown in FIG. 3. The light adjustment portion 10 shown in FIG. 3 has a thickness equal to the depth of the recess 1*b*, and the surface of the light adjustment portion 10 is flush with the second main surface 1*d*. Therefore, in the light emitting module 100A, the light adjustment layer 10 is positioned in the recess 1*b*, and the light emitting element 11 is positioned outside the recess 1*b*. The light adjustment portion may be positioned inside the recess, and have such a thickness that the light adjustment portion slightly protrude from a plane flush with the second main surface of the light guiding plate (not shown).

In the light emitting element unit 3 shown in FIG. 3, the outline of the light adjustment portion 10 is larger in size than the outline of the light emitting element 11. In the light emitting element unit 3, substantially all light emitted from the light emission surface 11*c* of the light emitting element 11 is transmitted through the light adjustment portion 10 before the light enters into the light guiding plate 1, so that color non-uniformity can be reduced.

The wavelength conversion portion 12 contains a wavelength conversion material added to a base material. The light diffusion portion 13 contains a diffusion material added to a base material. Examples of material for the base material can be a light transmissive material such as an epoxy resin, a silicone resin, a mixed resin thereof, or glass. From the viewpoint of light resistance of the light adjustment portion 10 and ease of forming, a silicone resin selected as the base material is beneficial. The base material for the light adjustment portion 10 is preferably a material having a refractive index higher than the material for the light guiding plate 1.

Examples of the wavelength conversion material contained in the wavelength conversion portion 12 include YAG fluorescent materials, β-sialon fluorescent materials, and fluoride-based fluorescent materials such as KSF-based fluorescent materials. In particular, when various types of wavelength conversion members are used for one wavelength conversion portion 12, more preferably the wavelength conversion portion 12 contains a β-sialon fluorescent material which emits green light and a fluoride-based fluorescent material such as a KSF-based fluorescent material which emits red light, the color reproduction range of the light emitting module can be expanded. In this case, it is preferable that the light emitting element 11 includes a nitride semiconductor ($In_xAl_yGa_{1-x-y}N$, $0 \le X$, $0 \le Y$, $X+Y \le 1$) capable of emitting short-wavelength light that can efficiently excite the wavelength conversion member. For example, the wavelength conversion portion 12 may contain a KSF-based fluorescent material (i.e., red fluorescent material) in an amount of 60% by weight or more, preferably 90% by weight or more so that red light can be obtained in use of the light emitting element 11 which emits blue light. That is, the wavelength conversion portion 12 may contain a wavelength conversion member which emits light of specific color, so that the light emitting element units emit light of specific color is emitted. In addition, the wavelength conversion material may be a quantum dot. In the wavelength conversion portion 12, the wavelength conversion material may be disposed in any form. For example, the wavelength conversion material may be substantially evenly distributed, or unevenly distributed. Alternatively, a multilayer each containing at least one wavelength conversion member may be provided.

The light diffusion portion 13 is configured with the above-described resin material as a base material with white powder added dispersed therein. Preferably, inorganic fine particles of $SiO_2$, $TiO_2$ or the like are used for the white powder.

Encapsulating Resin 15

The light emitting module 100 shown in FIG. 3 is provided by bonding the encapsulating resin 15 to the second main surface 1*d* of the light guiding plate 1. Preferably, the encapsulating resin 15 is formed using a white resin in which white powder and the like as an additive reflecting light is added to a transparent resin. The encapsulating resin 15 of white resin reflects light emitted from the outer peripheral portion or the electrode surface of the light emitting element 11, light emitted from the back surface of the light adjustment portion 10, light emitted from the back surface of the bonding wall 19, and light emitted from the second main surface 1*d* of the light guiding plate 1, so that light emitted from the light emitting element 11 can effectively exit outside from the first main surface 1*c* of the light guiding plate 1. In the light emitting module 100 shown in FIG. 3, the encapsulating resin 15 is sectioned into a first encapsulating resin 15A and a second encapsulating resin 15B. In the light emitting module 100 in the drawing, the encapsulating resin 15 is sectioned into the first encapsulating resin 15A which is integrally formed with the light emitting element unit 3, and the second encapsulating resin 15B which is bonded to the second main surface 1*d* of the light guiding plate 1. However, the encapsulating resin may have an integral structure without being sectioned into the first encapsulating resin 15A and the second encapsulating resin 15B. In this case, the light emitting module is manufactured in a manner that a light emitting element unit provided with no first encapsulating resin is bonded to a light guiding plate, and thereafter an encapsulating resin is bonded to a second main surface of the light guiding plate.

The light emitting module 100 in which the first encapsulating resin 15A and the second encapsulating resin 15B are sectioned is provided such that the first encapsulating resin 15A is bonded to the light emitting element 11 and the light adjustment portion 10 to form the first encapsulating resin 15A into a block having an integral structure with the light emitting element 11 and the light adjustment portion 10 in a process of manufacturing the light emitting module 100. The second encapsulating resin 15B is bonded to the second main surface 1*d* of the light guiding plate 1 such that the light emitting element unit 3 provided with the first encapsulating resin 15A is bonded to the light guiding plate 1, and thus the second encapsulating resin 15B fills gaps between first encapsulating resins 15A.

The first encapsulating resin 15A and the second encapsulating resin 15B are in contact with each other. Further, the first encapsulating resin 15A is in contact with the light emitting element 11. The first encapsulating resin 15A is present on the periphery of the light emitting element 11, and embeds the light emitting element 11. The electrodes 11*b* of the light emitting element 11 are exposed from the surface of the first encapsulating resin 15A. The outer lateral surfaces of the first encapsulating resin 15A are flush with the outer lateral surfaces of the light adjustment portion 10, and the first encapsulating resin 15A is also in contact with the light adjustment portion 10. The first encapsulating resin 15A is a part of the light emitting element unit 3 in which the light emitting element 11 is bonded to the light adjustment portion 10 as an integral structure, and the first encapsulating resin 15A is bonded to the light guiding plate 1. The first encapsulating resin 15A is preferably formed using a white resin, and the first encapsulating resin 15A is capable of improving the light emission efficiency of the light emitting module 100 by reflecting light emitted in a direction toward the outer lateral surfaces of the light emitting element 11. The second encapsulating resin 15B is in contact with the first encapsulating resin 15A at a boundary between the second main surface 1*d* of the light guiding plate 1 and the back surface (i.e., a surface close to the light emitting element 11) of the bonding wall 19. The second encapsulating resin 15B is provided such that a surface of the second encapsulating resin 15B is flush with a surface of the first encapsulating resin 15A on which the electrodes 11*b* are exposed. The second encapsulating resin 15B is bonded to the second main surface 1*d* of the light guiding plate 1, to which the light emitting element unit 3 having the first encapsulating resin 15A as an integral structure is bonded, so that the second encapsulating resin 15B is provided between first encapsulating resins 15A.

The second encapsulating resin 15B is stacked on the light guiding plate 1 to reinforce the light guiding plate 1. In addition, the second encapsulating resin 15B is preferably formed using a white resin, and reflect light to efficiently introduce light emitted from the light emitting element 11 into the light guiding plate 1, to thereby increase the light output of the first main surface 1*c* of the light guiding plate 1. Furthermore, the second encapsulating resin 15B formed using a white resin can serve as both a protection member for the light emitting element 11 and a reflection layer on the second main surface 1*d* of the light guiding plate 1, resulting in reduction in the thickness of the light emitting module 100.

For the encapsulating resin 15, a white resin having a reflectivity of 60% or more, preferably 90% or more, with respect to light emitted from the light emitting element 11 is suitable. The encapsulating resin 15 is preferably formed using a resin containing a white pigment such as white powder. In particular, a silicone resin containing inorganic white powder of titanium oxide or the like is preferable. Accordingly, an inexpensive material such as titanium oxide is used in a large amount for a member used in a relatively large amount to cover a surface of the light guiding plate 1, so that the cost of the light emitting module 100 can be reduced.

Light-Transmissive Bonding Member

In the light emitting module 100 shown in FIG. 3, a light-transmissive bonding member is used to bond the wavelength conversion portion 12 and the light diffusion portion 13, the light adjustment portion 10 and the light emitting element 11, and the light emitting element unit 3 and the light guiding plate 1. The light-transmissive bonding member bonds the wavelength conversion portion 12 to the light diffusion portion 13 to form the light adjustment portion 10, and bonds the light adjustment portion 10 to the light emitting element 11 to form the light emitting element unit 3. A light-transmissive bonding member 16A is the bonding agent 14 for bonding the light emitting element unit 3 to the bottom of the recess 1*b* of the light guiding plate 1. This light-transmissive bonding member 16A bonds the light emitting element unit 3 to the light guiding plate 1. The light-transmissive bonding member 16A is also the bonding agent 14 filling the ring gap 18 between the inner surfaces of the recess 1*b* and the insertion portion 17 for the light emitting element unit 3. This light-transmissive bonding member 16A forms the bonding wall 19 to bond the light adjustment portion 10 to the inner surface of the recess 1*b*.

The light-transmissive bonding member has a light transmittance of 60% or more, preferably 90% or more. The light-transmissive bonding member 16A propagates light emitted from the light emitting element 11 to the light guiding plate 1. The light-transmissive bonding member 16A may contain one or more additives, such as a light diffusion material or white powder that reflects light. Alternatively, the light-transmissive bonding member 16A may be formed only a light-transmissive resin material which does not contain a light diffusion material, white powder or the like.

As a material for the light-transmissive bonding member, a light-transmissive thermosetting resin material such as an epoxy resin or a silicone resin, or the like can be used.

Process of Manufacturing Light Emitting Module 100A

FIGS. 9A to 9D and 10A to 10D show a process of manufacturing the light emitting element unit 3A according to this embodiment.

Figure 9A:
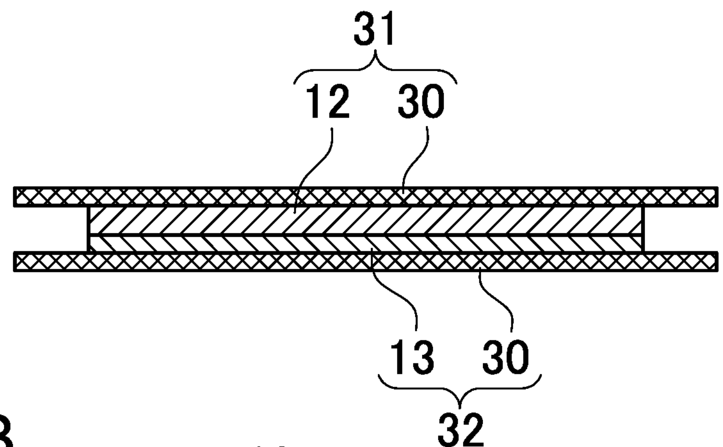
FIGS. 9A to 9D are enlarged schematic sectional view showing one example process of manufacturing the light emitting unit according to the embodiment.
Figure 9B:
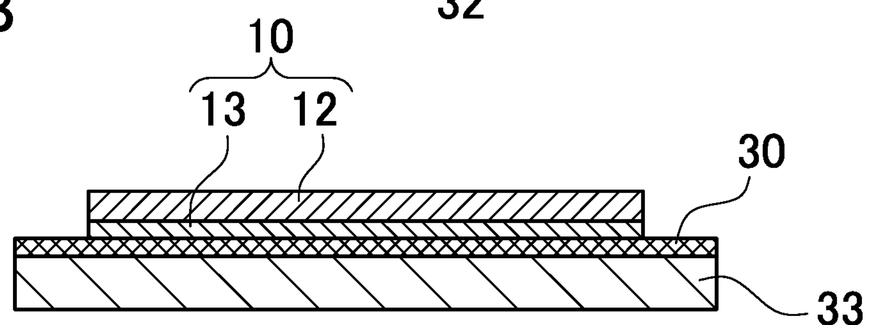

In the steps shown in FIGS. 9A and 9B, the wavelength conversion portion 12 and the light diffusion portion 13 are stacked to form the light adjustment portion 10.

In the step shown in FIG. 9A, a first sheet 31 obtained by attaching the wavelength conversion portion 12 to a surface of a base sheet 30 with a uniform thickness, and a second sheet 32 obtained by attaching the light diffusion portion 13 to a surface of the base sheet 30 with a uniform thickness are stacked with the wavelength conversion portion 12 bonded to the light diffusion portion 13. The wavelength conversion portion 12 is bonded to the light diffusion portion 13 with a light-transmissive bonding member. The wavelength conversion portion 12 and the light diffusion portion 13 are detachably attached to the base sheet 30 with, for example, an adhesive layer interposed therebetween.

Further, in the step shown in FIG. 9B, the base sheet 30 of the second sheet 32 is detachably attached to a plate 33, and the base sheet 30 bonded to the wavelength conversion portion 12 of the first sheet 31 is separated.

Figure 9C:
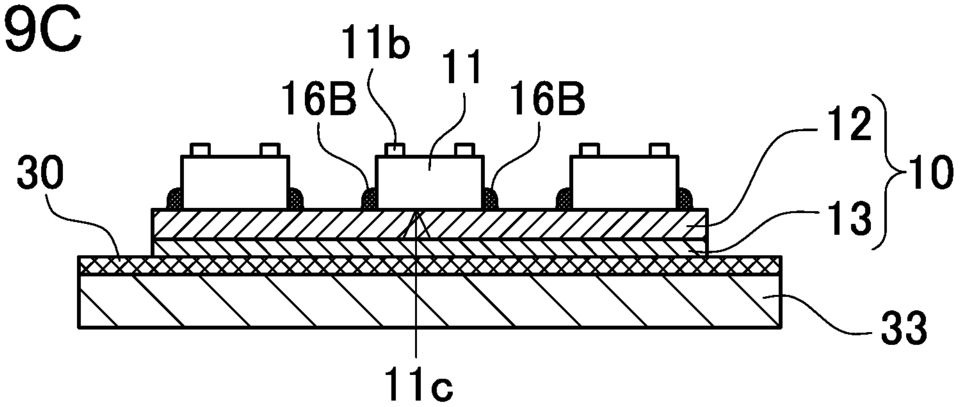

In the step shown in FIG. 9C, the light emitting element 11 is bonded to the light adjustment portion 10. The light emitting element 11 is bonded to the light adjustment portion 10 with the light emission surface 11*c* of the light emitting element 11 facing the light adjustment portion 10. The light emitting element 11 is bonded to the wavelength conversion portion 12 of the light adjustment portion 10 at a predetermined interval. Light emitting elements 11 are bonded to the light adjustment portion 10 with a light-transmissive bonding member interposed therebetween. The light-transmissive bonding member is supplied on a surface of the light adjustment portion 10 or a surface of the light emitting element 11 to bond the light emitting element 11 to the light adjustment portion 10. FIG. 9C shows a state in which a supplied light-transmissive bonding member 16B sticks out to the periphery of the light emitting element 11 to bond the light emitting element 11 to the light adjustment portion 10. The intervals between light emitting elements 11 can be adjusted to such a dimension that the outline of the light adjustment portion 10 has a predetermined size after cutting regions between light emitting elements 11 as shown in FIG. 10D. This is because the intervals between light emitting elements 11 determine the outline of the light adjustment portion 10.

Figure 9D:
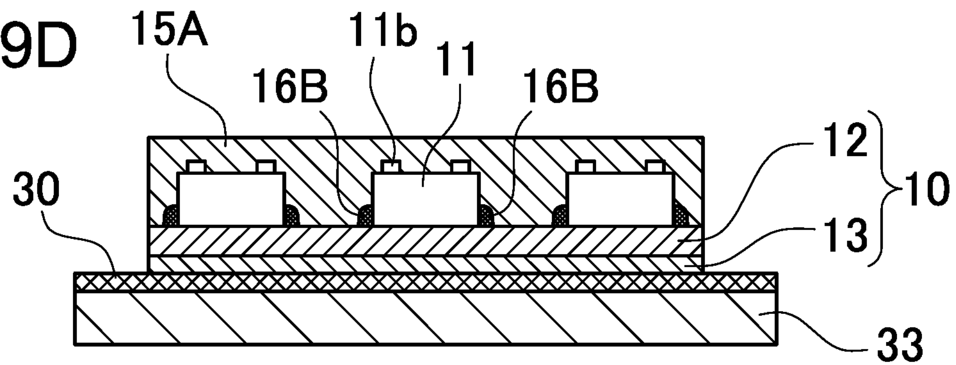

In the step shown in FIG. 9D, the first encapsulating resin 15A is formed so as to embed the light emitting element 11. The first encapsulating resin 15A is preferably formed using a white resin. The first encapsulating resin 15A formed using a white resin is supplied on a surface of the light adjustment portion 10, and cured with the light emitting element 11 embedded therein. The first encapsulating resin 15A is supplied with such a thickness that the light emitting element 11 is fully embedded. In the drawing, the first encapsulating resin 15A is supplied with such a thickness that the electrodes 11*b* of the light emitting element 11 are embedded.

Figure 10A:
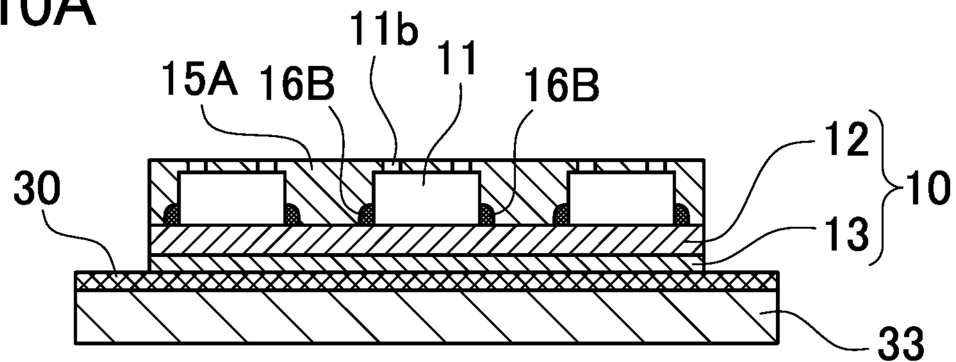
FIGS. 10A to 10D are enlarged schematic sectional view showing one example process of manufacturing the light emitting unit according to the embodiment.
Figure 10B:
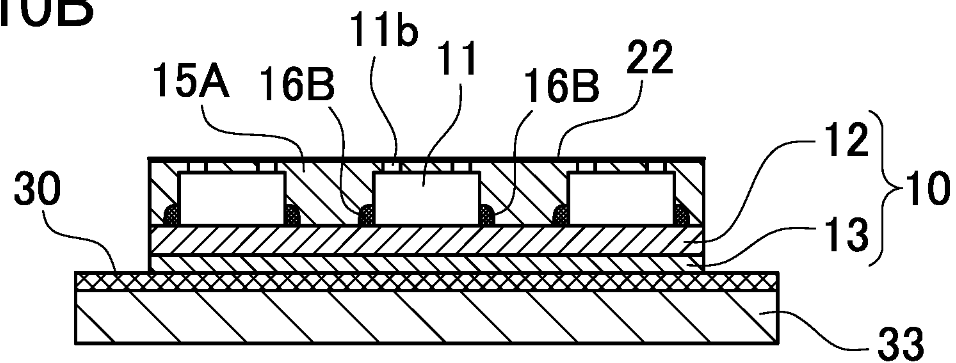

In the step shown in FIG. 10A, the cured white resin is polished to expose the electrode 11*b* of the light emitting element 11.

Electrode terminals 23 may be formed on the electrodes 11*b* of the light emitting element 11 using a metal film. In this case, for example, in the step shown in FIG. 10B, a metal film 22 is provided on a surface of the first encapsulating resin 15A. The metal film 22 can be formed, for example, by providing a metal film of copper, nickel, gold or the like is provided on a surface of the first encapsulating resin 15A by sputtering or the like, and connected to the electrode 11*b*.

Figure 10C:
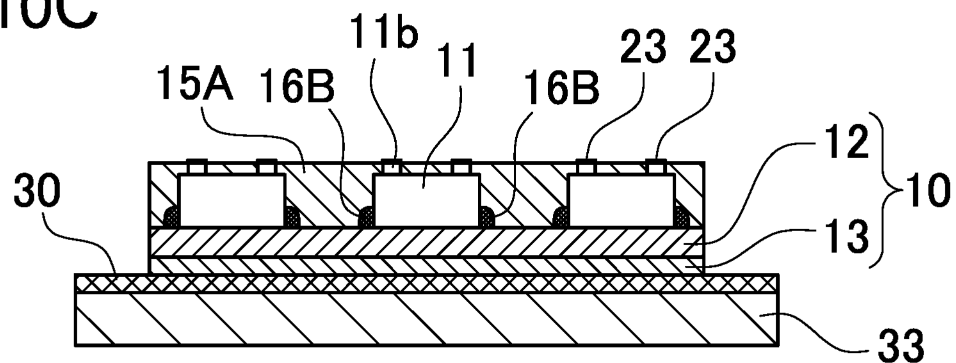
Figure 10D:
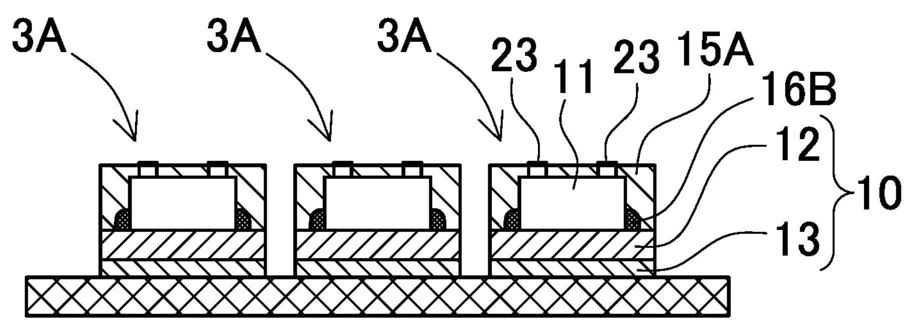

In the step shown in FIG. 10C, a part of the metal film 22 is removed such that the remaining parts of the metal film 22 are formed on the electrodes 11*b* to serve as the electrode terminal 23 for the light emitting element unit 3A. Removal of the metal film 22 can be performed by dry etching, wet etching, laser ablation or the like.

In the step shown in FIG. 10D, the first encapsulating resin 15A formed using a white resin, and a portion to be the light adjustment portion 10 are cut, and separated into the individual light emitting element units 3A. In the separated light emitting element unit 3A, the light emitting element 11 is bonded to the light adjustment portion 10, the first encapsulating resin 15A is provided on the periphery of the light emitting element 11, and the electrode terminals 23 are exposed from a surface of the first encapsulating resin 15A.

The light emitting element units 3A manufactured in the above steps are bonded to the recesses 1*b* of the light guiding plate in the steps shown in FIGS. 11A to 11C and 12A to 12C.

Figure 11A:
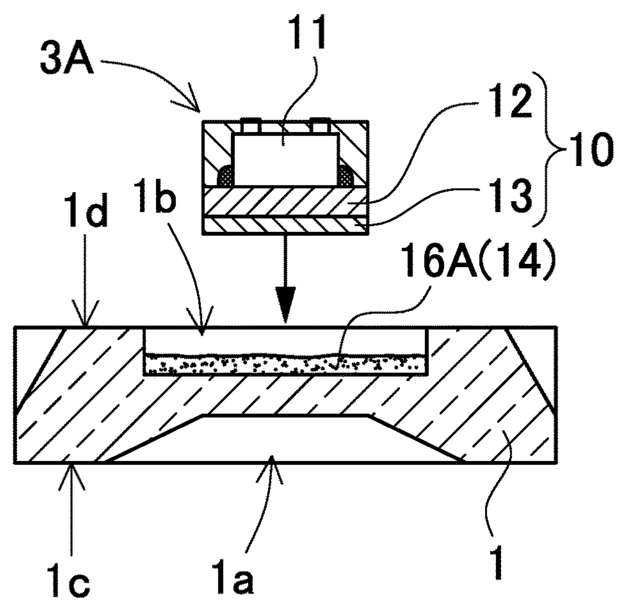
FIGS. 11A to 11C are enlarged schematic sectional view showing one example process of manufacturing the light emitting module according to the embodiment.
Figure 11B:
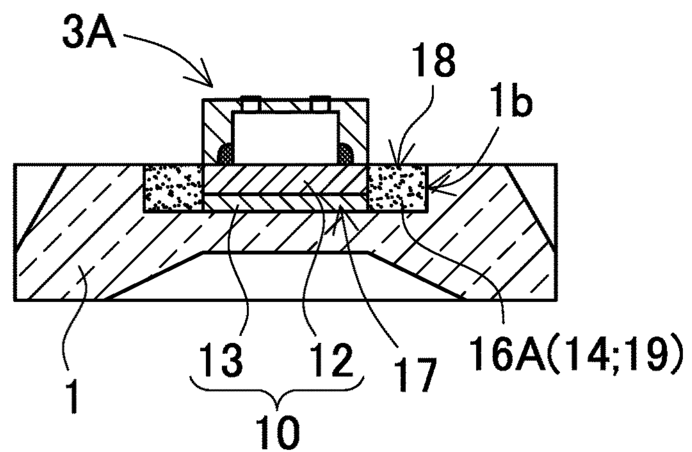

The light guiding plate 1 is formed using polycarbonate. As shown in FIGS. 11A and 11B, the light guiding plate 1 is formed by molding a thermoplastic resin such as polycarbonate, forming the recess 1*b* on the second main surface 1*d*, and providing the inverted truncated cone-shaped optically functional portion 1*a* on the first main surface 1*c*. The light emitting element unit 3A is bonded to the recess 1*b* of the light guiding plate 1. The light emitting element unit 3A is bonded to the light guiding plate 1 by inserting the light adjustment portion 10 into the recess 1*b* in which the liquid light-transmissive bonding member 16A is supplied in an uncured state, and curing the light-transmissive bonding member 16A. The light emitting element unit 3A is bonded to the light guiding plate 1 by inserting the light adjustment portion 10 accurately to the center of the recess 1*b*, and curing the light-transmissive bonding member 16A. The amount of the uncured light-transmissive bonding member 16A to be supplied in the recess 1*b* is adjusted such that the light-transmissive bonding member 16A is forced out into the ring gap 18 to make the surface of the bonding wall 19 substantially flush with the second main surface 1*d* of the light guiding plate 1 at the time of bonding the light emitting element unit 3A to the light guiding plate 1. Alternatively, filling the ring gap 18 with the uncured light-transmissive bonding member can be performed after the light emitting element units 3 are bonded to the light guiding plate 1, and in this case also the surface of the bonding wall 19 can be flush with the second main surface 1*d* of the light guiding plate 1. Therefore, the amount of the uncured light-transmissive bonding member 16A initially supplied into the recess 1*b* is such an amount that the surface level of the bonding wall 19 is lower than the level of the second main surface 1*d* of the light guiding plate 1, in other words, such a small amount that the surface of the light-transmissive bonding member 16A is positioned in the ring gap 18, before bonding the light emitting element unit 3A to the recess 1*b*. Then the light emitting element unit 3A is bonded to the light guiding plate 1, thereafter the light-transmissive bonding member is supplied into the ring gap 18 to make the surface of the bonding wall 19 substantially flush with the second main surface 1*d* of the light guiding plate 1.

The light-transmissive bonding member 16A that bonds the light adjustment portion 10 to the bottom of the recess 1*b* is in contact with the surfaces of the light adjustment portion 10 and the bottom of the recess 1*b*, and cured to bond the surface of the light adjustment portion 10 to the bottom of the recess 1*b*. Further, the light-transmissive bonding member 16A forced out from a gap between the light adjustment portion 10 and the bottom of the recess 1*b* forms the bonding wall 19, so that the lateral surfaces of the light adjustment portion 10 is bonded to the inner lateral surfaces of the recess 1*b*. In this manufacturing method, the uncured liquid light-transmissive bonding member 16A filling the recess 1*b* is forced out into the ring gap 18 to form the bonding wall 19. Also, the light-transmissive bonding member 16A filling the recess 1*b* is used as the bonding agent 14, and therefore the supplying amount of the light-transmissive bonding member 16A needs to be adjusted so that the bonding wall 19 is substantially flush with the second main surface 1*d* of the light guiding plate 1. When the supplying amount of the light-transmissive bonding member 16A is small, the surface of the bonding wall 19 is positioned lower than the second main surface 1*d* of the light guiding plate 1 as shown in FIG. 7. Conversely, when the supplying amount of the light-transmissive bonding member 16A is large, the bonding wall 19 runs out from the ring gap 18, so that the surface of the bonding wall 19 protrudes from the second main surface 1*d* of the light guiding plate 1 as shown in FIG. 8. When the surface of the bonding wall 19 is not flush with the second main surface 1*d* of the light guiding plate 1, light distribution on the periphery of a light emitting portion is less likely to be desirable. This is because the light-transmissive bonding member running out from the recess 1*b* or a gap that is not filled with the light-transmissive bonding member causes undesirable light distribution. The supplying amount of the light-transmissive bonding member 16A is adjusted so that the bonding wall 19 is substantially flush with the second main surface 1*d* of the light guiding plate 1, because a slightly uneven supplying amount causes deviation of relative positions of the bonding wall 19 and the second main surface 1$d$ of the light guiding plate 1.

In the light emitting module 100A of this embodiment, the volume of the bonding wall 19 is larger than a partial volumetric capacity inside the recess, which is substantially the same as the volume of the light emitting element unit 3A disposed or overlapped in the recess 1$b$. Therefore the partial volumetric capacity in the recess is substantially the same as the volume of the light adjustment portion 10 of the light emitting element unit 3, since the light adjustment portion 10 is dipped in the bonding agent 14 thus the light adjustment portion 10 of the light emitting element unit 3 is positioned in the recess 1$b$ as shown in FIG. 11B. Such configuration can prevent or alleviate the deviation of relative position between the surface level of the bonding wall 19 and the second main surface 1$d$ of the light guiding plate 1 caused by unevenness of the supplying amount of the light-transmissive bonding member 16A. Therefore, in this embodiment, the volume of the entire bonding wall 19 is larger than the volume of the light adjustment portion 10. By making the volumetric capacity of the bonding wall 19 being larger than that of the insertion portion 17, i.e., the light adjustment portion 10 of the light emitting element unit 3, it can reduce level difference of the surfaces of the bonding wall 19 to the second main surface 1$d$ of the light guiding plate 1 caused by a variance in amount of the bonding agent 14 (to be the light-transmissive bonding member 16A) supplied in the recess 1$b$.

As a specific example configuration, the inner surface outline of a recess is a quadrangular shape having a length of 0.6 mm on each side, with a depth of 0.2 mm, the outline of a light adjustment portion is a quadrangular shape having a length of 0.5 mm on each side, with a thickness of 0.2 mm, and the light adjustment portion is disposed in the recess. In this case, the partial volume in the recess of the light emitting element unit 3A is 0.05 $mm^3$, and the volume of the bonding wall 19 is 0.022 $mm^3$, so that the volume of the bonding wall 19 is about a half of the partial volume in the recess of the light emitting element unit 3A.

For maintaining the level difference of the surfaces of the bonding walls 19 within ±0.01 mm in this structure, the supplying amount of the light-transmissive bonding member needs to be extremely accurately controlled to within ±0.0036 $mm^3$.

As an alternative configuration, the inner surface outline of the recess 1$b$ is a quadrangular shape having a size of 1.0 mm on each side, with the same depth as that of the above example configuration, the partial volume of the light emitting element unit 3A in the recess is likewise 0.05 $mm^3$, and therefore the volume of the entire bonding wall 19 is 0.15 $mm^3$ which is about 3 times the recess internal volume. Then for adjusting the level difference of the surface of the bonding wall 19 to within ±0.01 mm, tolerance of the supplying amount of the light-transmissive bonding member may be within ±0.01 $mm^3$, which is about 2.8 times as large as that described above.

Thus, in the light emitting module 100, the volumetric capacity of the ring gap 18 is increased to increase the total volume of the bonding wall 19, even if the amount of the light-transmissive bonding member 16A supplied in the recess 1$b$ is slightly different, the surfaces of the bonding walls 19 are likely to be even, whereas such surfaces are substantially flush with the surface of the second main surface 1$d$ of the light guiding member 1. Further, the thick bonding wall 19 transmits light radiated from the light adjustment portion 10 before the light is guided to the light guiding plate 1, and therefore by a structure in which the thick bonding wall 19 different from the light guiding plate 1 is stacked between the light guiding plate 1 and the light adjustment portion 10, light is more uniformly dispersed, and exits to outside from the light guiding plate 1. The light emitting module can be manufactured by bonding the light emitting element units 3A to the recesses 1$b$ respectively, supplying the light-transmissive bonding member 16A to form the bonding walls 19 having surfaces positioned lower than the second main surface 1$d$ of the light guiding plate 1, thereafter supplying the light-transmissive bonding member 16A to form the bonding walls 19 having surfaces substantially flush with the second main surface 1$d$ of the light guiding plate 1 accurately. In this manufacturing process also, even if the amount of the light-transmissive bonding member 16A supplied in the recess 1$b$ is slightly different, the surfaces of the bonding walls 19 are likely to be even, whereas such surfaces are substantially flush with the surface of the second main surface 1$d$ of the light guiding member 1.

Figure 11C:
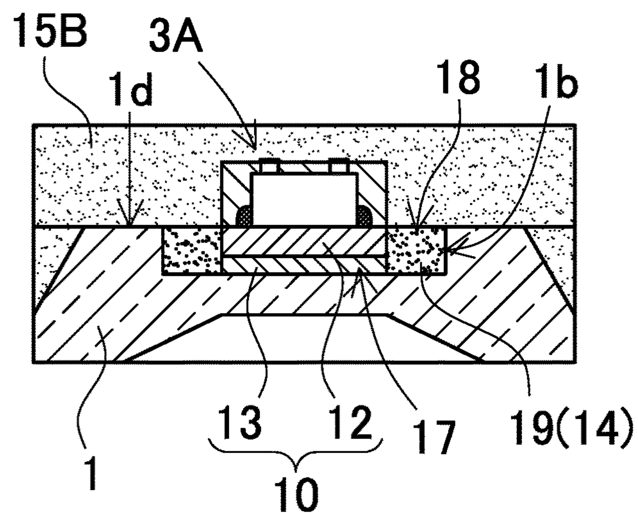

After the light emitting element unit 3A is bonded to the light guiding plate 1, the second encapsulating resin 15B is formed on the second main surface 1$d$ of the light guiding plate 1 in the step shown in FIG. 11C. The second encapsulating resin 15B is formed using a white resin with such a thickness that the light emitting element unit 3A is embedded therein.

Figure 12A:
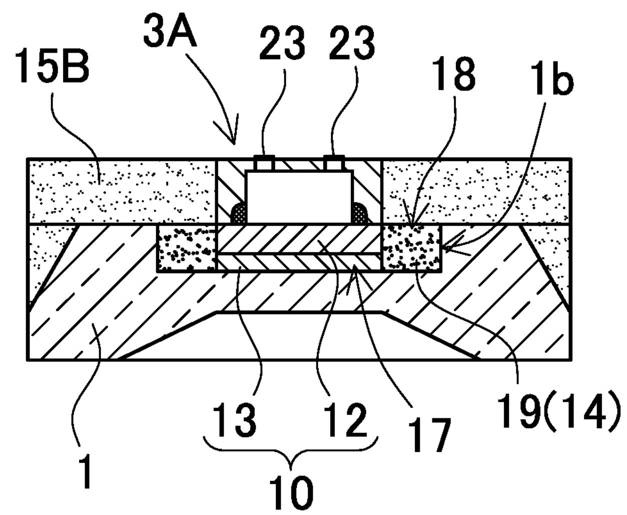
FIGS. 12A to 12C are enlarged schematic sectional view showing one example process of manufacturing the light emitting module according to the embodiment.

In the step shown in FIG. 12A, the surface of the cured second encapsulating resin 15B is polished to expose the electrode terminal 23 to the surface.

In the step shown in FIG. 11C, the second encapsulating resin 15B is formed with such a thickness that the light emitting element unit 3 is embedded therein, but the second encapsulating resin 15B can be formed with such a thickness that the surface of the second encapsulating resin 15B is flushes with the surface of the electrode terminals 23, or at a position lower than the surface of the electrode terminals 23, in order to omit the polishing step.

Figure 12B:
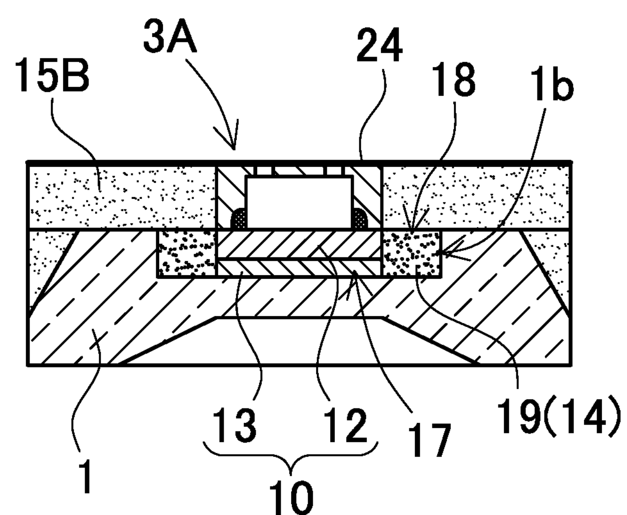

In the step shown in FIG. 12B, an electrically conductive film 24 is stacked on the surface of the encapsulating resin 15. In this step, a metal film 24 of Cu/Ni/Au is formed on substantially the entire surface of each of the electrode terminals 23 of the light emitting element 11 and the encapsulating resin 15 by sputtering.

Figure 12C:
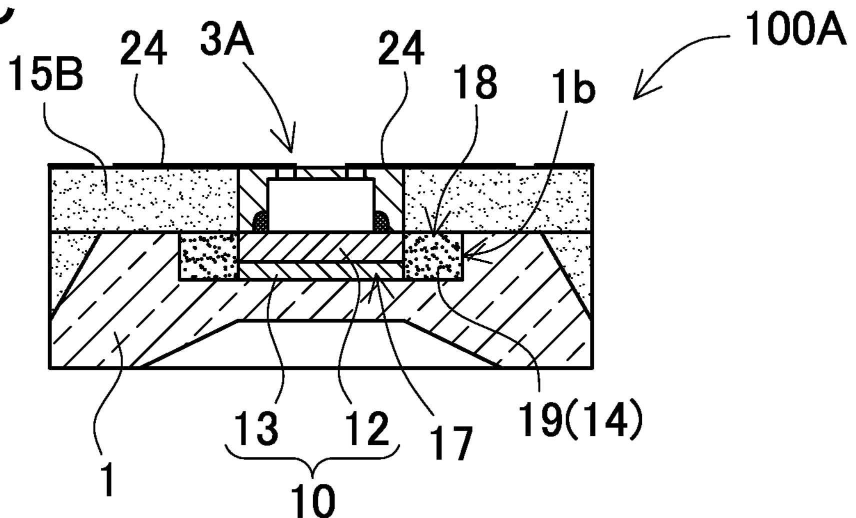

In the step shown in FIG. 12C, a part of the electrically conductive film 24 is removed, and each of the light emitting elements 11 is electrically connected through the electrically conductive film 24.

In the above steps, the light emitting module 100 is manufactured in which a plurality of light emitting element units 3 is bonded to one light guiding plate 1. The light emitting module including the light emitting bit 5 in which the light emitting element unit 3 is bonded to one light guiding plate 1' can be manufactured by providing the light emitting element unit 3 as shown in FIGS. 9A to 9D and 10A to 10D, bonding the light emitting element unit 3 bonded to one recess 1$b$ of the light guiding plate 1 in the steps shown in FIGS. 11A and 11B, bonding the second encapsulating resin 15B to the light guiding plate 1 in the step shown in FIG. 11C, polishing the surface of the second encapsulating resin 15B to expose the electrode terminals 23 in the step shown in FIG. 12A, stacking the electrically conductive film 24 in the step shown in FIG. 12B, and removing part of the electrically conductive film 24 to allow the electrode terminals 23 to be individually separated and electrically connecting the electrically conductive film 24 in the step shown in FIG. 12C.

The above light emitting module 100A is manufactured in a following manner that the light adjustment portion 10 in which the light diffusion portion 13 and the wavelength conversion portion 12 are stacked is fixed to the light emitting element 11, and the light emitting element unit 3A, in which the light adjustment portion 10 with the light diffusion portion 13 is bonded to the light emitting element 11, is bonded to the light guiding plate 1. The light emitting module 100A has such a structure that the light diffusion portion 13 can be efficiently disposed at a predetermined position on the light guiding plate 1 in a desirable state because the light diffusion portion 13 is stacked on the wavelength conversion portion 12, and disposed in the recess 1*b* of the light guiding plate 1. However, the light diffusion portion 13 is not necessarily stacked on the wavelength conversion portion 12, before being bonded to the recess 1*b* of the light guiding plate 1, but as shown in FIGS. 13 and 16A to 16C, the light diffusion portion 13 may be bonded to the bottom of the recess 1*b* of the light guiding plate 1, thereafter a light emitting element unit 3B including the wavelength conversion portion 12 integrally bonded with the light emitting element 11 can be bonded to the recess 1*b* of the light guiding plate 1.

Figure 13:
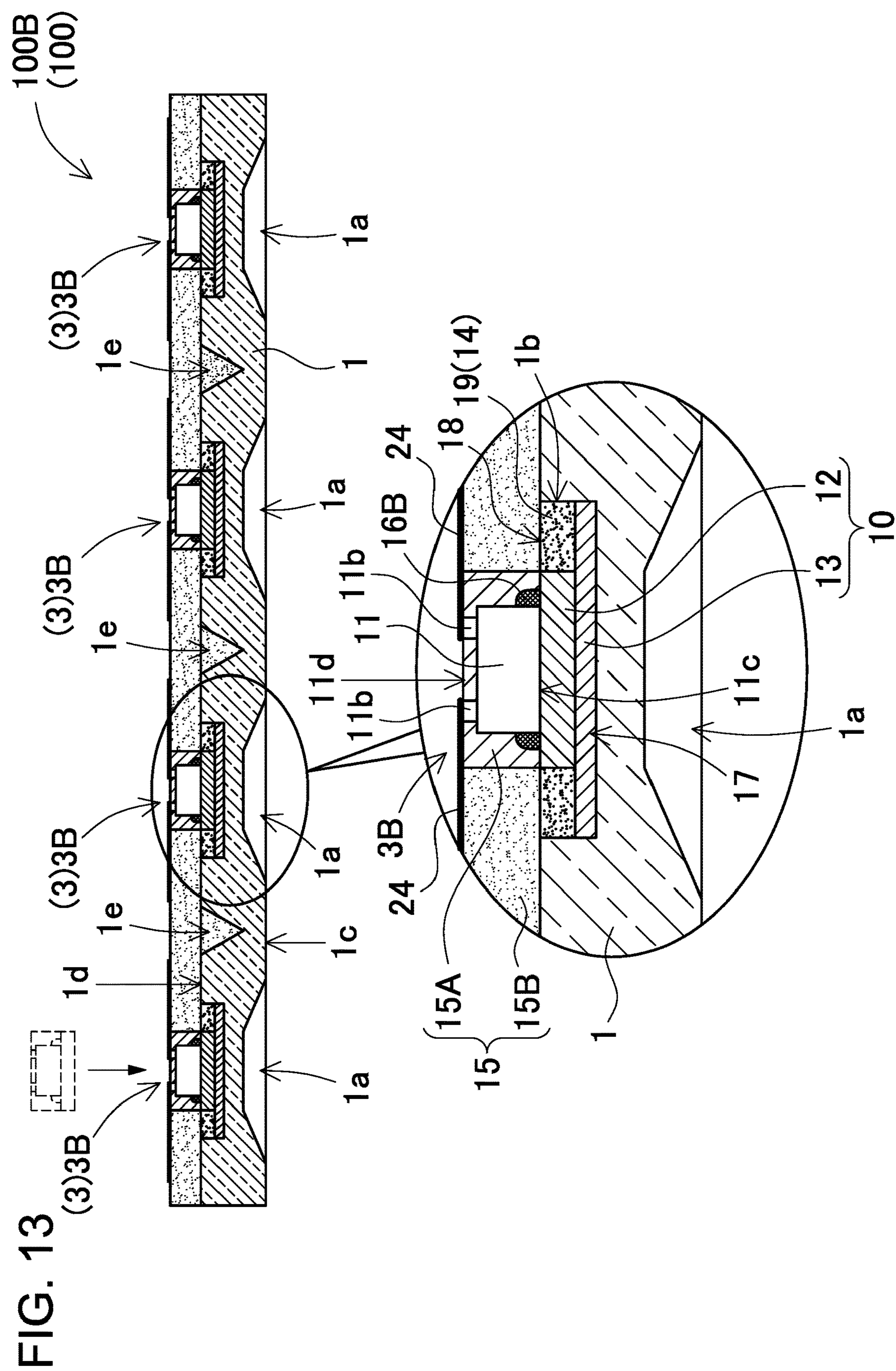
FIG. 13 is a partially enlarged schematic sectional view of a light emitting module according to certain embodiment, where the light emitting module is upside down with a light guiding plate positioned on the lower side.

A light emitting module 100B shown in FIG. 13 may be manufactured in a following manner that the light emitting element unit 3B obtained by bonding the wavelength conversion portion 12 to the light emitting element 11 is bonded to the light diffusion portion 13 provided in the recess 1*b* of the light guiding plate 1 without preliminarily bonding the light diffusion portion 13 to the wavelength conversion portion 12. In the light emitting module 100B, the light diffusion portion 13 is bonded to the bottom of the recess 1*b* of the light guiding plate 1, and thereafter the light emitting element unit 3B including the wavelength conversion portion 12 and the light emitting element 11 as an integral structure is disposed in the recess 1*b*, and bonded to the recess 1*b* of the light guiding plate 1 by bonding the wavelength conversion portion 12 to the light diffusion portion 13. In the light emitting module 100B, the wavelength conversion portion 12 of the light emitting element unit 3B is bonded to the light diffusion portion 13 in the recess 1*b*, and the light adjustment portion 10 including a layer with the wavelength conversion portion 12 is bonded to the light diffusion portion 13, is disposed in the recess 1*b*.

The light emitting element unit 3B is manufactured in the steps shown in FIGS. 14A to 14C and 15A to 15D.

Figure 14A:
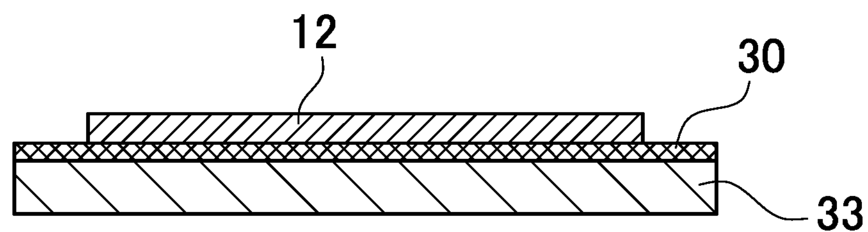
FIGS. 14A to 14C are enlarged schematic sectional view showing one example process of manufacturing the light emitting unit according to the embodiment.
Figure 14B:
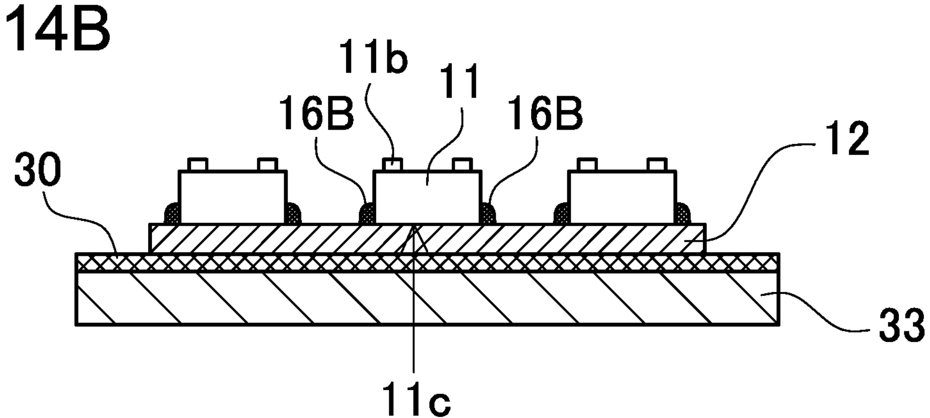

As shown in FIG. 14A, the base sheet 30 with the wavelength conversion portion 12 attached to a surface thereof with a uniform thickness is detachably attached to the plate 33. In the step shown in FIG. 14B, the light emitting element 11 is bonded to the wavelength conversion portion 12. The light emitting element 11 is bonded to the wavelength conversion portion 12 such that the light emission surface 11*c* of the light emitting element 11 faces the wavelength conversion portion 12 side. The light emitting element 11 is bonded to the wavelength conversion portion 12 at a predetermined interval. The light emitting element 11 is bonded to the wavelength conversion portion 12 with the light-transmissive bonding member 16B interposed therebetween. The light-transmissive bonding member 16B is supplied on a surface of the wavelength conversion portion 12 or the light emitting element 11 to bond the light emitting element 11 to the wavelength conversion portion 12. FIG. 14B shows a state in which the supplied light-transmissive bonding member 16B sticks out to the periphery of the light emitting element 11 to bond the light emitting element 11 to the wavelength conversion portion 12.

Figure 14C:
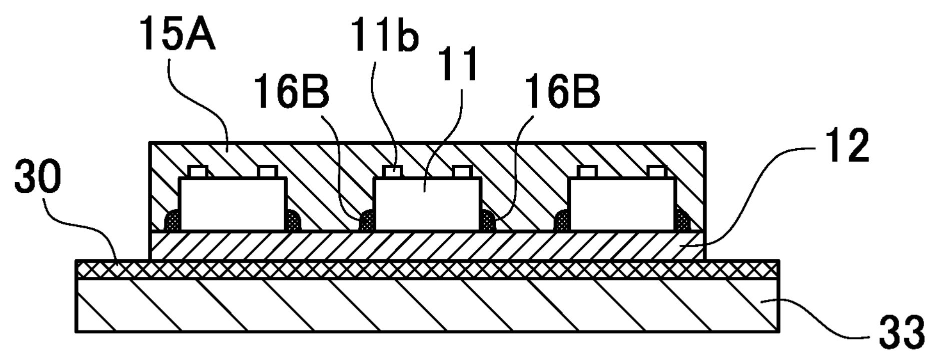

In the step shown in FIG. 14C, the first encapsulating resin 15A is formed so as to embed the light emitting element 11. The first encapsulating resin 15A is preferably formed using a white resin. The first encapsulating resin 15A formed using a white resin is supplied on a surface of the wavelength conversion portion 12, and cured with the light emitting element 11 embedded therein. The first encapsulating resin 15A is supplied with such a thickness that the light emitting element 11 is fully embedded. In the drawing, the first encapsulating resin 15A is supplied in such a thickness that the electrode 11*b* of the light emitting element 11 is embedded.

In the steps shown in FIGS. 15A to 15D, the cured white resin is polished to expose the electrodes 11*b* of the light emitting element 11, thereafter the metal film 22 is provided on the surface of the first encapsulating resin 15A, and connected to the electrode 11*b*. A part of the metal film 22 is removed by dry etching, wet etching, laser ablation or the like, and the metal film 22 is stacked on the electrodes 11*b* to form the electrode terminals 23 of the light emitting element unit 3B.

Figure 15A:
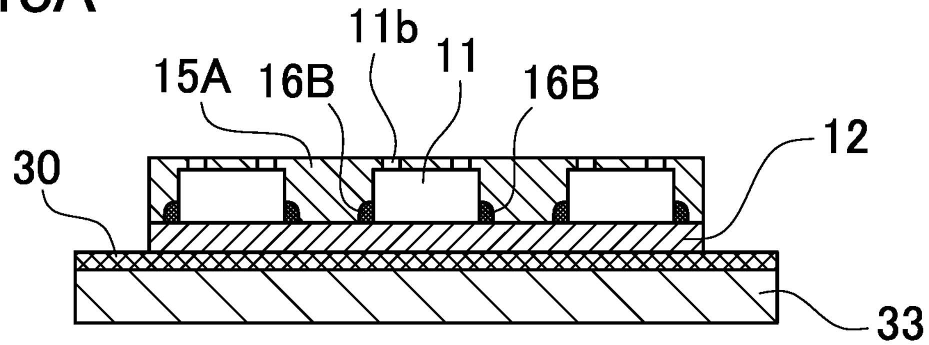
FIGS. 15A to 15D are enlarged schematic sectional view showing one example process of manufacturing the light emitting unit according to the embodiment.
Figure 15B:
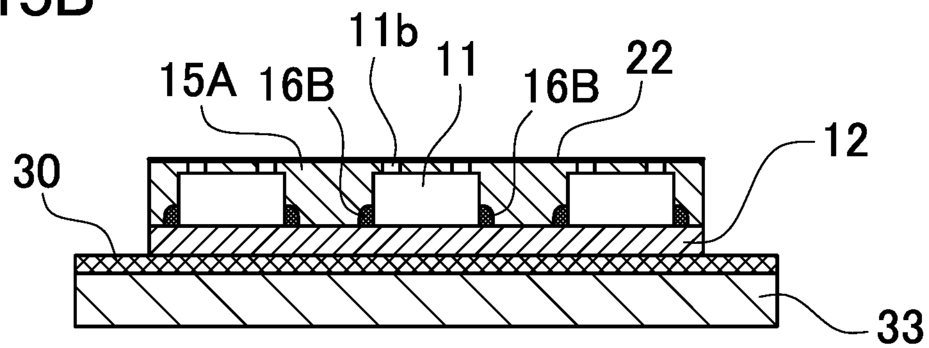
Figure 15C:
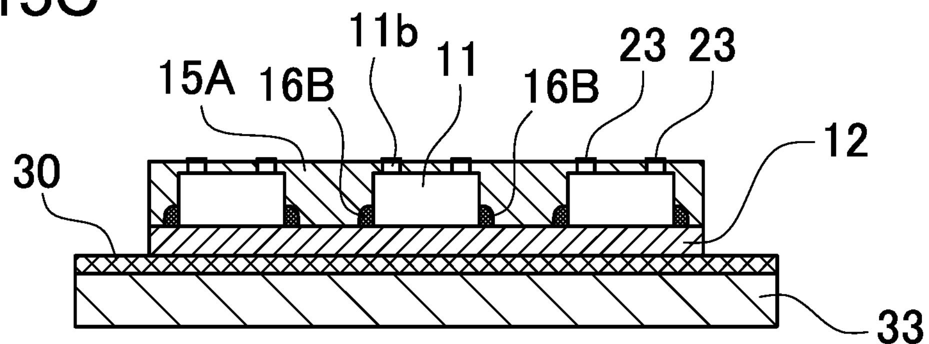
Figure 15D:
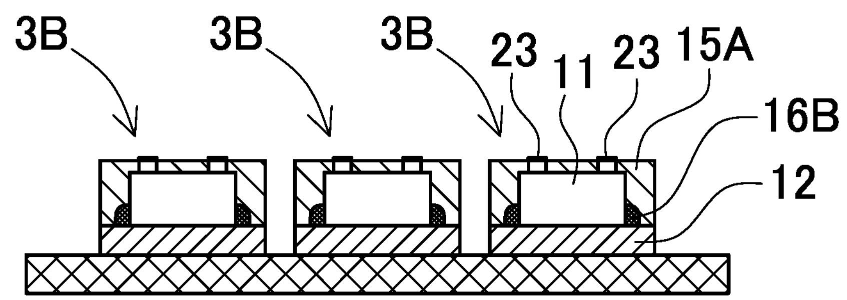

In the step shown in FIG. 15D, the first encapsulating resin 15A formed using a white resin, and a layer to be the wavelength conversion portion 12 are cut, and separated into the individual light emitting element units 3B. In each of the separated light emitting element units 3B, the light emitting element 11 is bonded to the wavelength conversion portion 12, the first encapsulating resin 15A is provided on the periphery of the light emitting element 11, and the electrode terminals 23 are exposed from the surface of the first encapsulating resin 15A. In the light emitting element unit 3B, the outer lateral surfaces of the wavelength conversion portion 12 are flush with the outer lateral surfaces of the first encapsulating resin 15A, and the light emitting element 11 is embedded in the first encapsulating resin 15A.

In the steps shown in FIGS. 16A to 16D and 17A to 17C, the light emitting element unit 3B manufactured in the above steps is bonded to the recess 1*b* of the light guiding plate 1 with the light diffusion portion 13 provided on the bottom of the recess 1*b*.

Figure 16A:
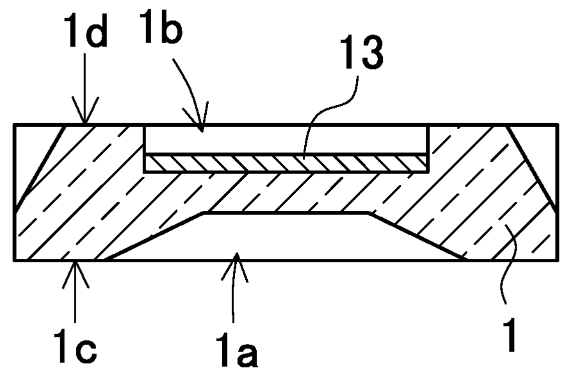
FIGS. 16A to 16D are enlarged schematic sectional view showing one example process of manufacturing the light emitting module according to the third embodiment.

In the step shown in FIG. 16A, the light diffusion portion 13 is formed on the bottom of the recess 1*b* of the light guiding plate 1. The light diffusion portion 13 is formed on the bottom of the recess 1*b* with a predetermined thickness.

Figure 16B:
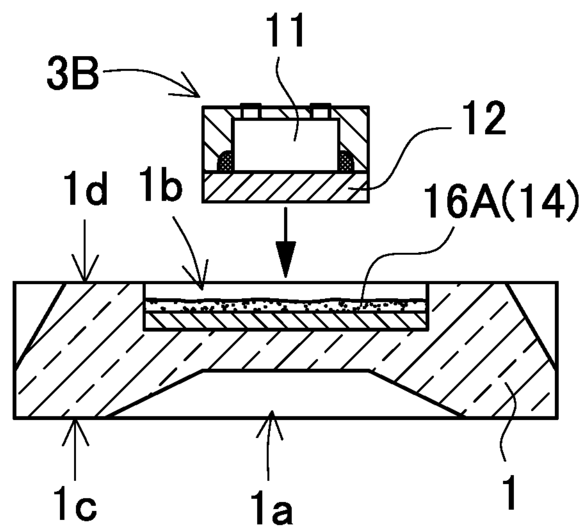
Figure 16C:
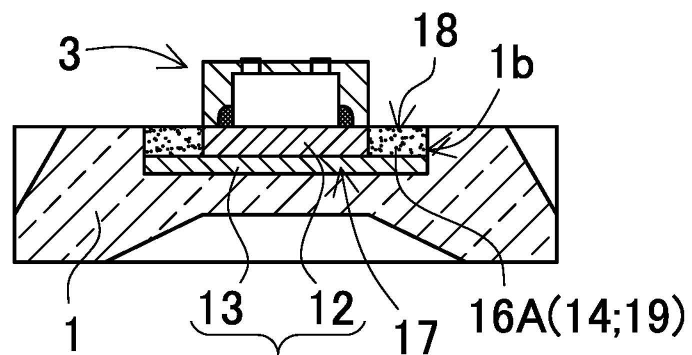

In the step shown in FIG. 16B, the wavelength conversion portion 12 of the light emitting element unit 3B is bonded to the light diffusion portion 13 provided in the recess 1*b* of the light guiding plate 1. The surface of the light diffusion portion 13 provided on the bottom inside the recess 1*b* of the light guiding plate 1 is covered with the uncured liquid light-transmissive bonding member 16A. The wavelength conversion portion 12 of the light emitting element unit 3B is inserted into the recess 1*b* covered with the light-transmissive bonding member 16A, and the wavelength conversion portion 12 of the light emitting element unit 3B is bonded to the light diffusion portion 13 to bond the light emitting element unit 3B to the light guiding plate 1. The light emitting element unit 3B is bonded to the light guiding plate 1 by accurately inserting the wavelength conversion portion 12 to the center of the recess 1*b*, and curing the light-transmissive bonding member 16A. In this state, the light adjustment portion 10 including a layer with the wavelength conversion portion 12 is bonded to the light diffusion portion 13 is formed in the recess 1*b*. The supplying amount of the uncured light-transmissive bonding member 16A supplied in the recess 1*b* is adjusted so that the light-transmissive bonding member 16A is forced out into the ring gap 18 to make the surface of the bonding wall 19 substantially flush with the second main surface 1*d* of the light guiding plate 1 at the time of bonding the light emitting element unit 3B to the light guiding plate 1.

The light-transmissive bonding member 16A which bonds the wavelength conversion portion 12 to the light diffusion portion 13 provided in the recess 1*b* is in contact with the surfaces of the wavelength conversion portion 12 and the light diffusion portion 13, and cured to bond the surface of the wavelength conversion portion 12 to the surface of the light diffusion portion 13. Further, the light-transmissive bonding member 16A forced out from a gap between the wavelength conversion portion 12 and the light diffusion portion 13 forms the bonding wall 19, so that the outer periphery of the wavelength conversion portion 12 is bonded to the inner peripheral surface of the recess 1*b*. In this manufacturing method, the uncured liquid light-transmissive bonding member 16A supplying the recess 1*b* is forced into the ring gap 18 to form the bonding wall 19. In this method, the light-transmissive bonding member 16A supplying the recess 1*b* is used as the bonding agent 14, and therefore the supplying amount of the light-transmissive bonding member 16A is adjusted so that the bonding wall 19 is substantially flush with the second main surface 1*d* of the light guiding plate 1.

In the light emitting module 100B shown in FIG. 13, the volume of the bonding wall 19 is larger than a partial volumetric capacity in the recess which is defined as a partial volume of the light emitting element unit 3B disposed or overlapped in the recess 1*b* provided with the light diffusion portion 13. Therefore the partial volumetric capacity in the recess 1*b* is substantially the same as the volume of the light adjustment portion 10 of the light emitting element unit 3B including the wavelength conversion portion 12, since the light adjustment portion 10 is dipped in the bonding agent 14 thus the light adjustment portion 10 of the light emitting element unit 3 is positioned in the recess 1*b*. Such configuration can prevent or alleviate the deviation of relative position between the surface level of the bonding wall 19 and the second main surface 1*d* of the light guiding plate 1 caused by unevenness of the supplying amount of the light-transmissive bonding member 16A. Therefore, in this embodiment, the volume of the entire bonding wall 19 is larger than the volume of the wavelength conversion portion 12. By making the volumetric capacity of the bonding wall 19 being larger than that of the insertion portion 17, i.e., the light adjustment portion 10 of the light emitting element unit 3, it can reduce level difference of the surfaces of the bonding wall 19 to the second main surface 1*d* of the light guiding plate 1 caused by a variance in amount of the bonding agent 14 (to be the light-transmissive bonding member 16A) supplied in the recess 1*b*. Thus, in the light emitting module 100B, the volumetric capacity of the ring gap 18 is increased to increase the total volume of the bonding wall 19, even if the amount of the light-transmissive bonding member 16A supplied in the recess 1*b* is slightly different, the surfaces of the bonding walls 19 are likely to be even, whereby such surfaces are substantially flush with the surface of the second main surface 1*d* of the light guiding member 1.

Figure 16D:
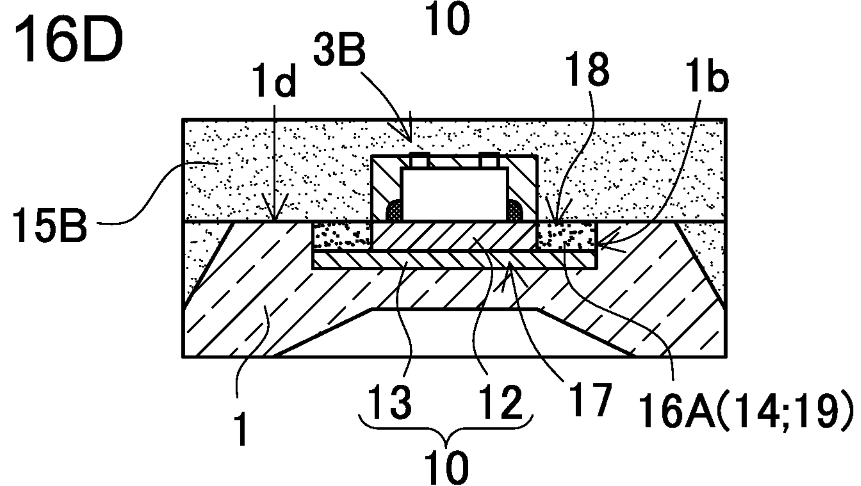
Figure 17A:
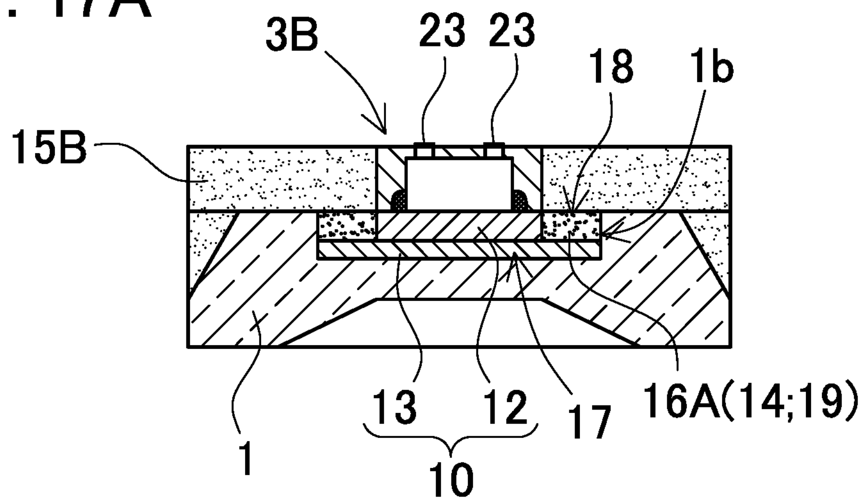
FIGS. 17A to 17C are enlarged schematic sectional view showing one example process of manufacturing the light emitting module according to the embodiment.
Figure 17B:
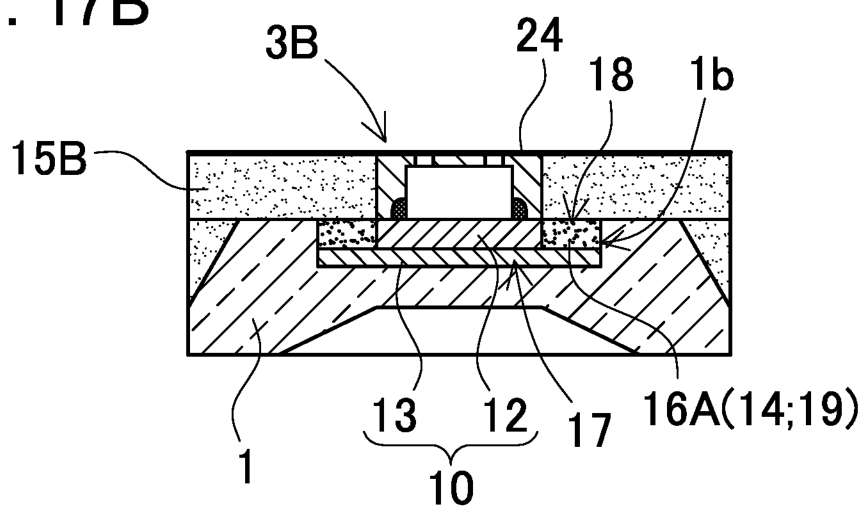
Figure 17C:
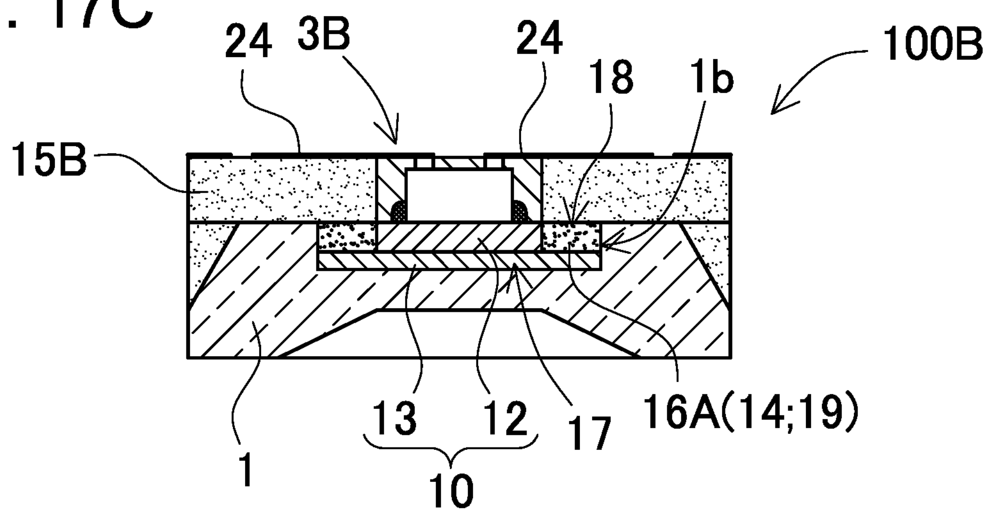

After the light emitting element unit 3B is bonded to the light guiding plate 1, the second encapsulating resin 15B is formed on the second main surface 1*d* of the light guiding plate 1 in the step shown in FIG. 16D. The second encapsulating resin 15B is formed using a white resin with such the thickness that the light emitting element unit 3 is embedded therein. In the step shown in FIG. 17A, the surface of the cured second encapsulating resin 15B is polished to expose the electrode terminals 23 to the surface. Thereafter, in the steps shown in FIGS. 17B and 17C, the electrically conductive film 24 is stacked on the surface of the encapsulating resin 15, thereafter the electrically conductive film 24 is partially removed to allow the separated electrically conductive film 24 to be individually provided on the electrode terminals 23, thereby electrically connecting the separated electrically conductive film 24 to the electrode terminals 23.

In the above steps, the light emitting module 100B is manufactured in which a plurality of light emitting element units 3B is bonded to one light guiding plate 1. A method of manufacturing the light emitting module including the light emitting bit 5 in which one light emitting element unit 3B is bonded to one light guiding plate 1' includes: providing the light emitting element unit 3B is prepared as in FIGS. 14A to 14C and 15A to 15D; providing the light diffusion portion 13 in the recess 1*b* of the light guiding plate 1 in the steps shown in FIGS. 16A to 16C, and bonding the wavelength conversion portion 12 of the light emitting element unit 3 to the light diffusion portion 13 to form the light adjustment portion 10; bonding the second encapsulating resin 15B to the light guiding plate 1 in the step shown in the step shown in FIG. 16D; polishing the surface of the second encapsulating resin 15B to expose the electrode terminals 23 the step shown in FIG. 17A; stacking the electrically conductive film 24 in the step shown in FIG. 17B; and removing part of the electrically conductive film 24 to allow the separated electrically conductive film 24 to be individually provided on the electrode terminals 23, thereby electrically connecting the separated electrically conductive film 24 to the electrode terminals 23 in the step shown in FIG. 17C.

Figure 18:
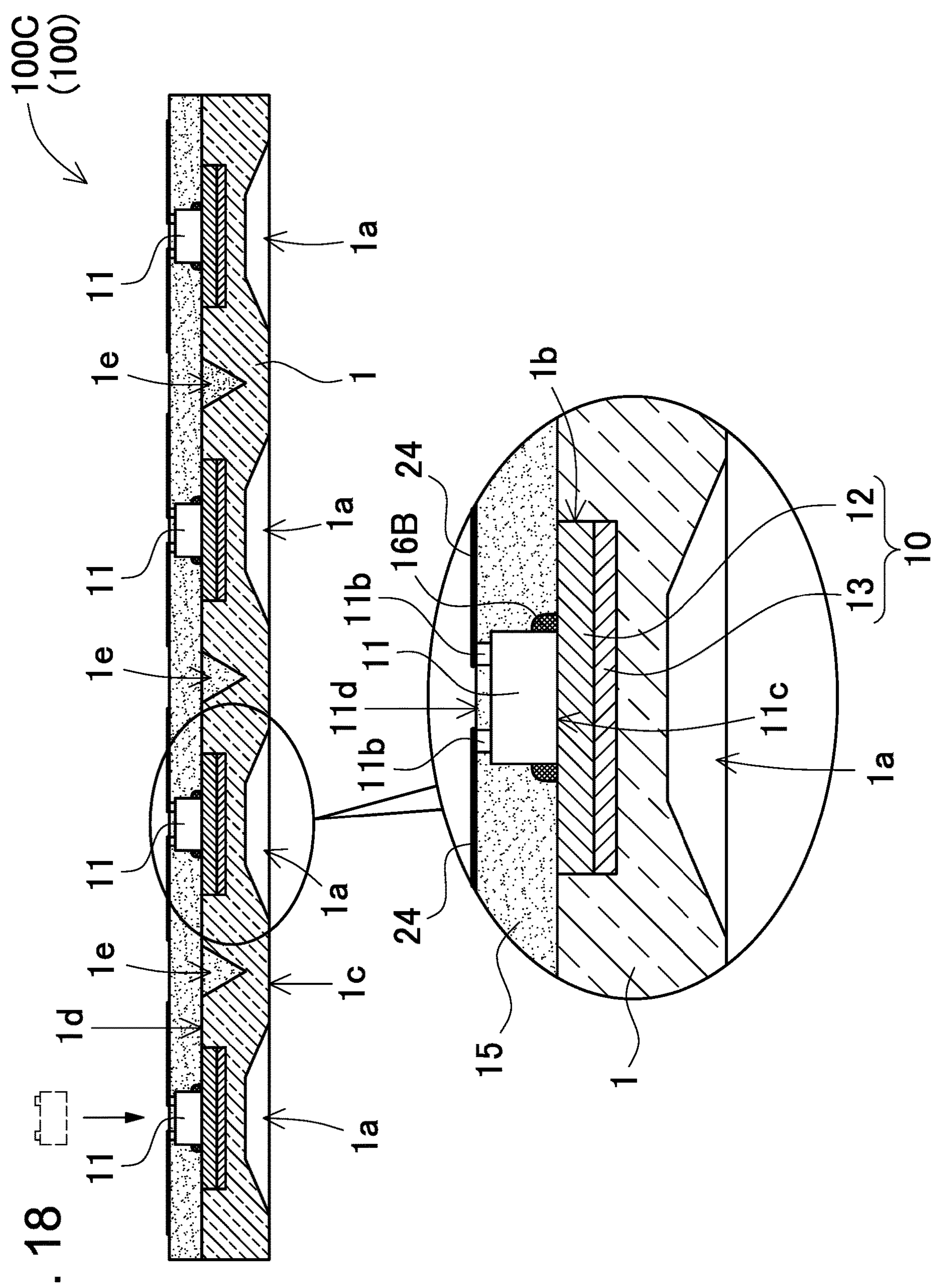
FIG. 18 is a partially enlarged schematic sectional view of a light emitting module according to certain embodiment, where the light emitting module is upside down with a light guiding plate positioned on the lower side.

Further, a light emitting module 100C in FIG. 18 may be manufactured in the manner that the light diffusion portion 13 and the wavelength conversion portion 12 are bonded to the recess 1*b* of the light guiding plate 1 to provide the light adjustment portion 10, and the light emitting element 11 is bonded to the surface of the wavelength conversion portion 12 of the light adjustment portion 10 without bonding the wavelength conversion portion 12 and the light diffusion portion 13 to the light emitting element 11. The light emitting module 100C is manufactured in the following steps shown in FIGS. 19A to 19C, 20A to 20C, 21A and 21B.

Figure 19A:
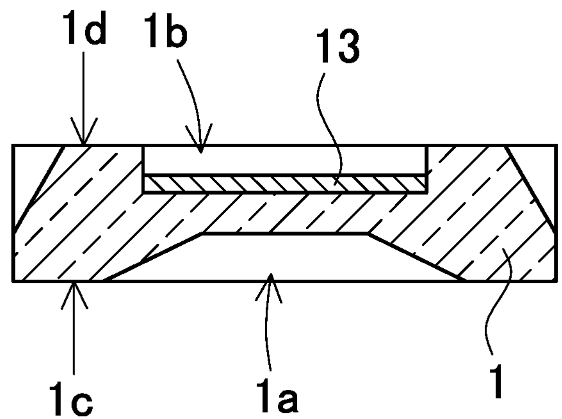
FIGS. 19A to 19C are enlarged schematic sectional view showing one example process of manufacturing the light emitting module according to the embodiment.
Figure 19B:
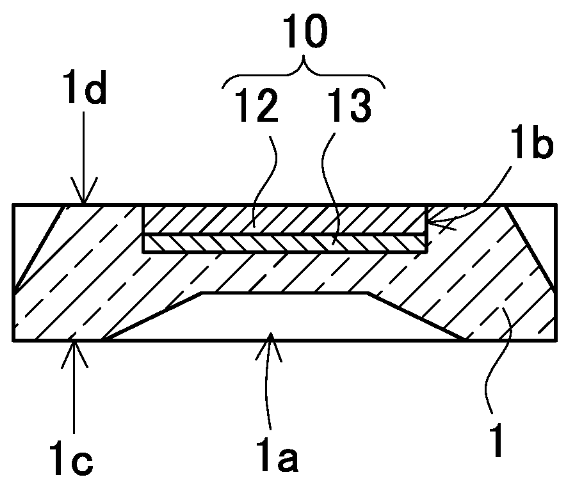

In the step shown in FIG. 19A, the light diffusion portion 13 is formed on the bottom of the recess 1*b* of the light guiding plate 1. The light diffusion portion 13 is formed and bonded on the bottom portion of the recess 1*b* with a predetermined thickness. Subsequently, in the step shown in FIG. 19B, the wavelength conversion portion 12 is formed on the surface of the light diffusion portion 13 provided in the recess 1*b* and on the bottom of the recess 1*b* of the light guiding plate 1. The wavelength conversion portion 12 is stacked on and bonded to the light diffusion portion 13. In this state, the light adjustment portion 10 including a portion with the wavelength conversion portion 12 being bonded to the light diffusion portion 13 is formed in the recess 1*b*.

Figure 19C:
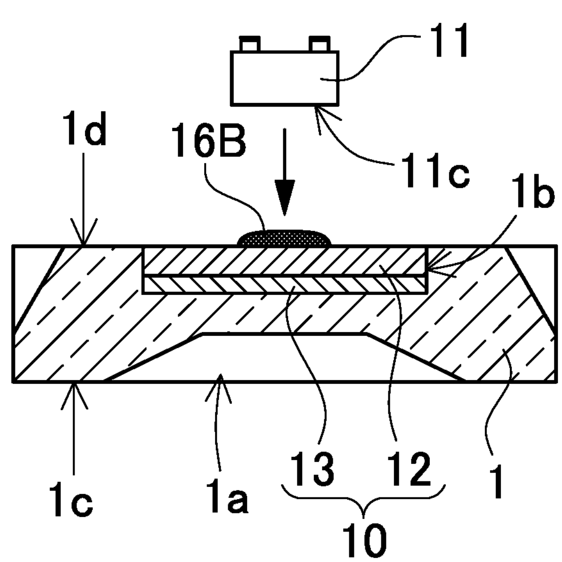
Figure 20A:
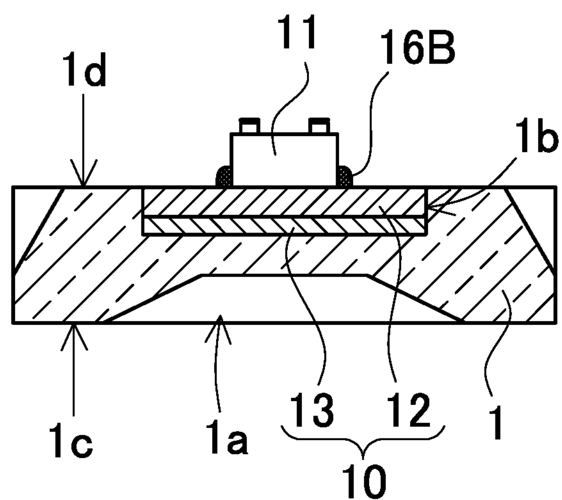
FIGS. 20A to 20C are enlarged schematic sectional view showing one example process of manufacturing a light emitting module according to the embodiment.

In the step shown in FIG. 19C, the light emitting element 11 is bonded to the wavelength conversion portion 12 of the light adjustment portion 10. The light emitting element 11 is bonded at the center of the wavelength conversion portion 12 such that the light emission surface 11*c* of the light emitting element 11 faces the wavelength conversion portion 12 side. The light emitting element 11 is bonded to the wavelength conversion portion 12 with the light-transmissive bonding member 16B interposed therebetween. The light-transmissive bonding member 16B is supplied in the surface of the wavelength conversion portion 12 or the surface of the light emitting element 11 to bond the light emitting element 11 to the wavelength conversion portion 12. FIG. 20A shows a state in which the supplied light-transmissive bonding member 16B sticks out to the periphery of the light emitting element 11 to bond the light emitting element 11 to the wavelength conversion portion 12.

Figure 20B:
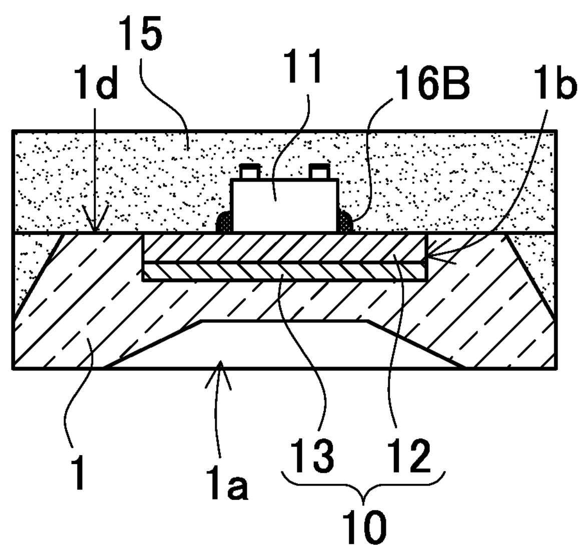

After the light emitting element 11 is bonded to the wavelength conversion portion 12 to bond the light emitting element 11 to the light guiding plate 1, in the step shown in FIG. 20B, the encapsulating resin 15 is formed on the second main surface 1*d* of the light guiding plate 1. The encapsulating resin 15 is present on the periphery of the light emitting element 11, and is bonded to the second main surface 1*d* of the light guiding plate 1 with such a thickness that the light emitting element 11 is fully embedded. For the encapsulating resin 15, a white resin is used. In the light emitting module 100C, the encapsulating resin 15 integrally covers the periphery of the light emitting element 11 and the surface side of the second main surface 1*d* of the light guiding plate 1 without providing the first encapsulating resin in the periphery of the light emitting element 11.

Figure 20C:
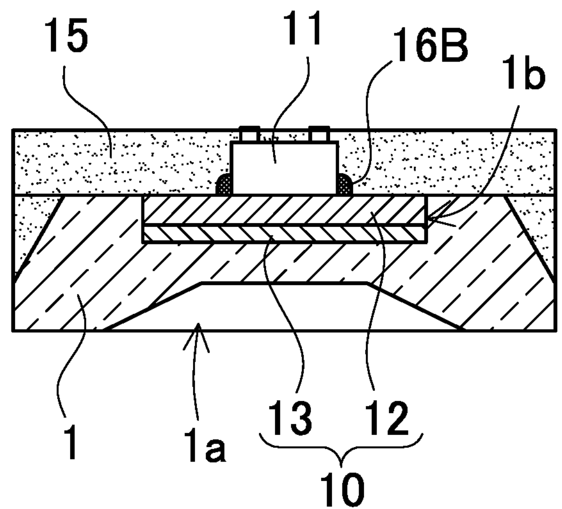
Figure 21A:
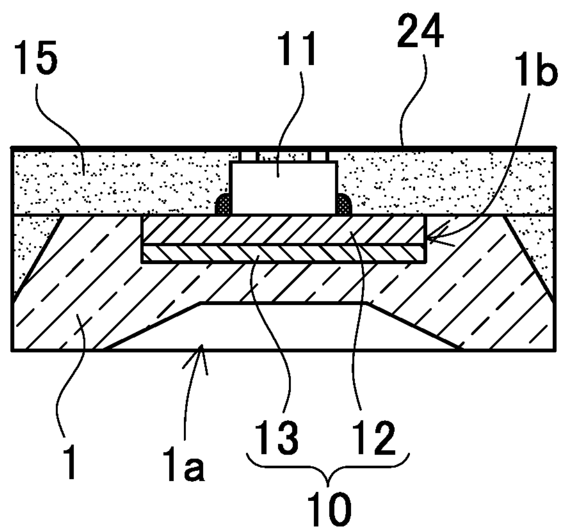
FIGS. 21A and 21B are enlarged schematic sectional view showing one example process of manufacturing the light emitting module according to the embodiment.
Figure 21B:
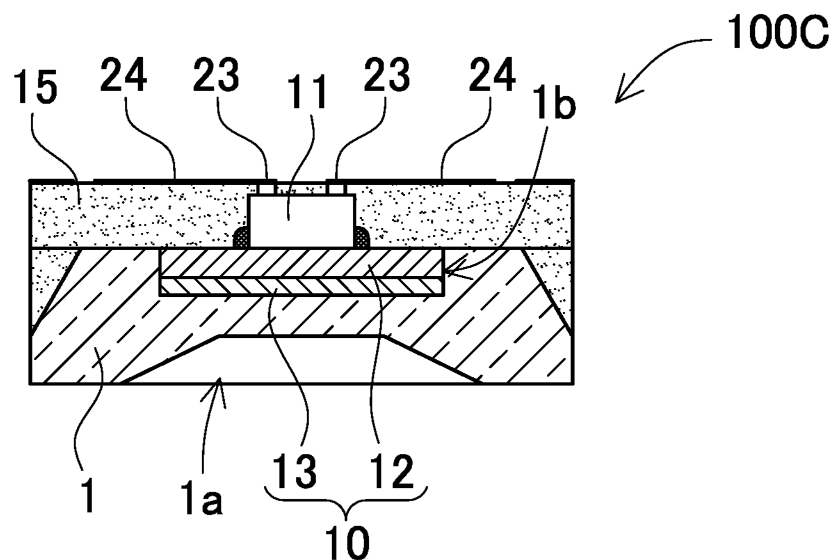

In the step shown in FIG. 20C, the surface of the cured encapsulating resin 15 is polished such that the electrode terminals 23 are exposed form the surface of the encapsulating resin 15. Thereafter, in the steps shown in FIGS. 21A and 21B, the electrically conductive film 24 is stacked on the surface of the encapsulating resin 15, the electrically conductive film 24 is then partially removed to allow the separated electrically conductive film 24 to be individually provided on the electrode terminals 23, thereby electrically connecting the separated electrically conductive film 24 to the electrode terminals 23.

In the above steps, a plurality of recesses 1 is provided on one light guiding plate 1, and in the light adjustment portion 10 is provided in each recess 1*b* by stacking the light diffusion portion 13 and the wavelength conversion portion 12, followed by bonding the light emitting element 11 to the wavelength conversion portion 12 of the light adjustment portion 10 to manufacture the light emitting module 100C. A method of manufacturing the light emitting bit 5 includes: providing the light adjustment portion 10 by disposing the light diffusion portion 13 on the bottom of the recess 1*b* of the light guiding plate 1, and by bonding the wavelength conversion portion 12 on the light diffusion portion 13 in the step shown in FIGS. 19A and 19B; and bonding the light emitting element 11 in the center of the surface of the wavelength conversion portion 12 of the light adjustment portion 10 in the step shown in FIGS. 19C and 20A; thereafter, providing the encapsulating resin 15 on the second main surface 1*d* of the light guiding plate 1 in the step shown in FIG. 20B; polishing the surface of the encapsulating resin 15 to expose the electrode terminal 23; stacking the electrically conductive film 24 on the surface of the encapsulating resin 15; and removing part of the electrically conductive film 24 to allow the separated electrically conductive film 24 to be individually provided on the electrode terminals 23, thereby electrically connecting the separated electrically conductive film 24 to the electrode terminals 23 in the steps shown in FIGS. 20C, 21A and 21B.

Figure 22:
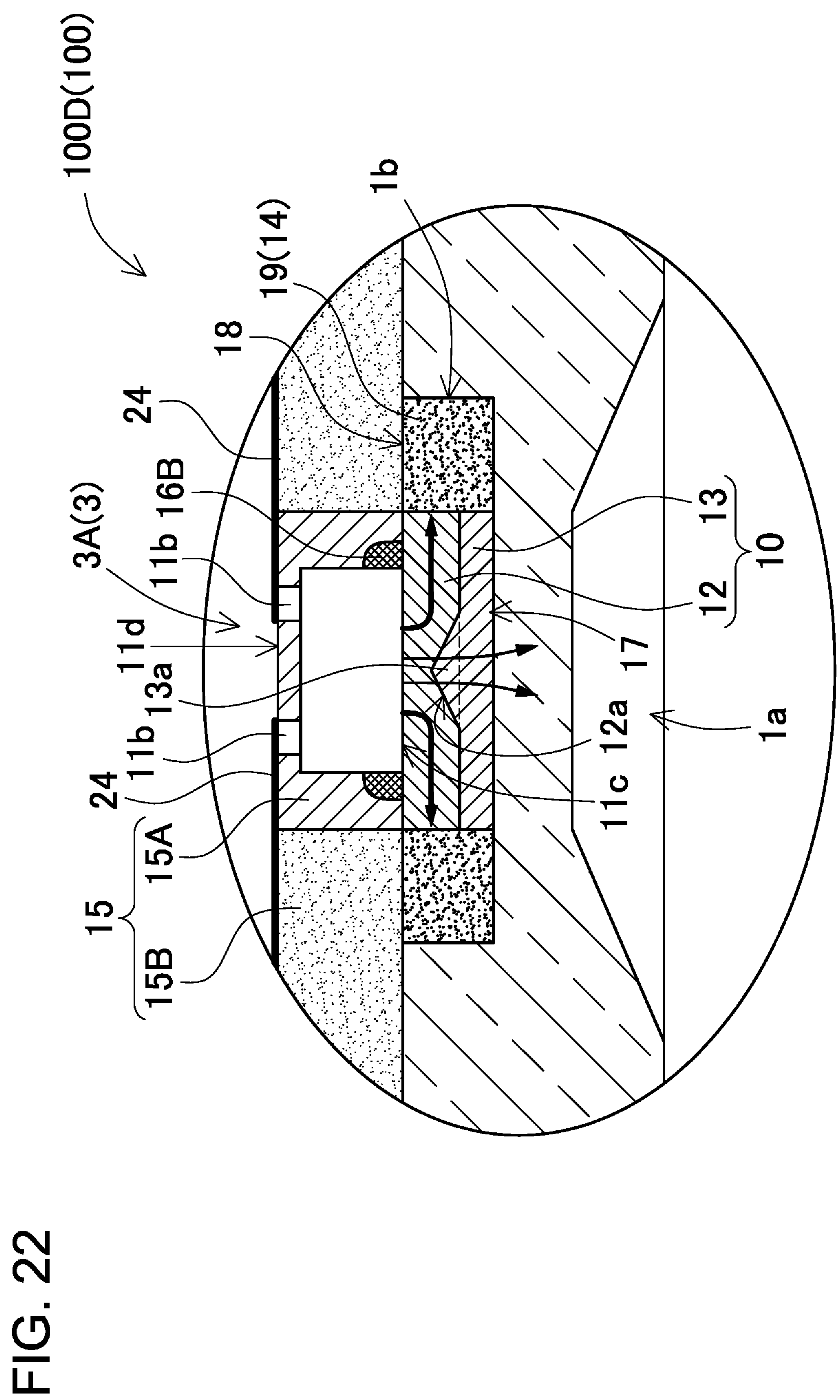
FIG. 22 is an enlarged schematic sectional view of a light emitting module according to certain embodiment, where the light emitting module is upside down with a light guiding plate positioned on the lower side.
Figure 23:
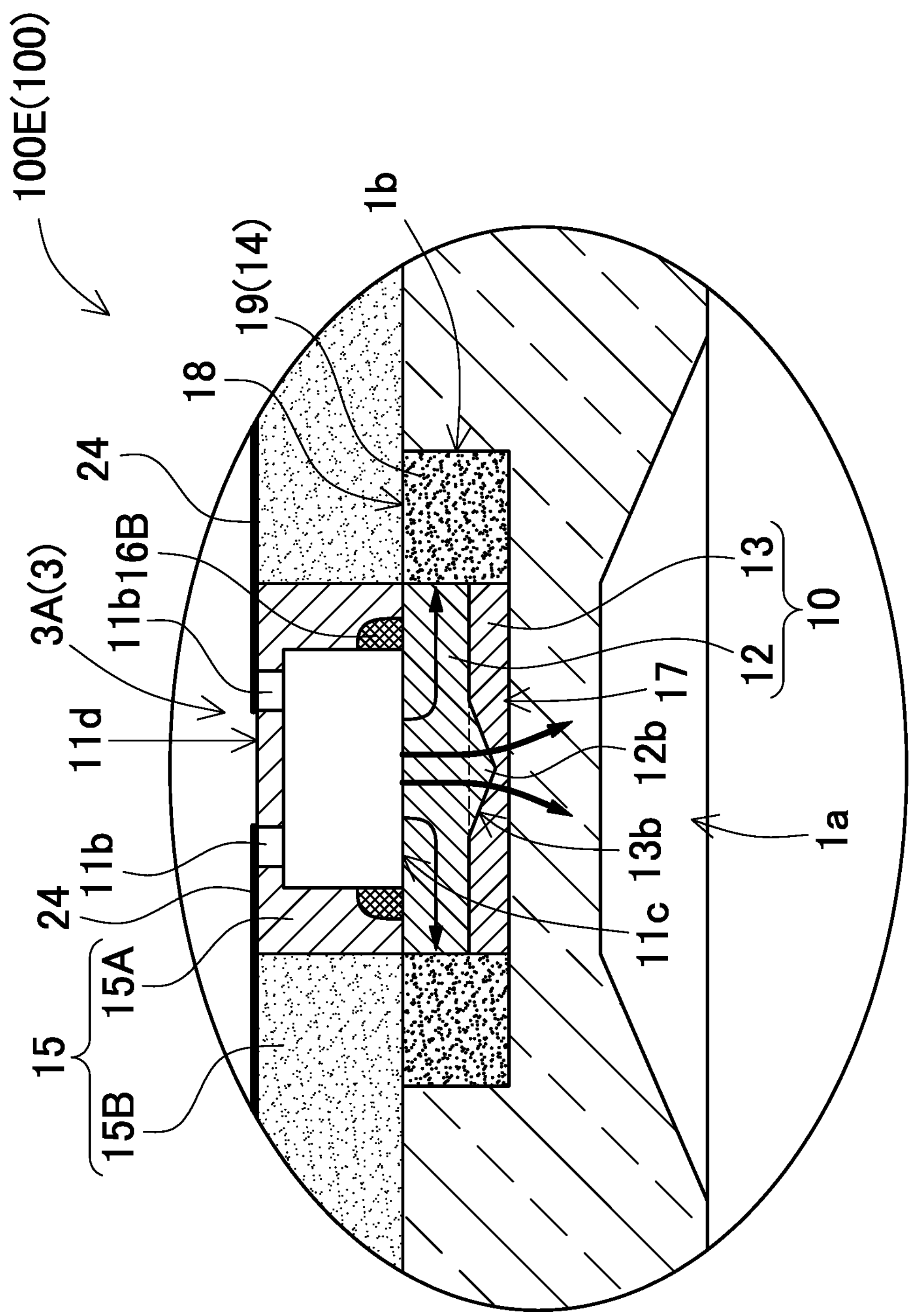
FIG. 23 is an enlarged schematic sectional view of a light emitting module according to a sixth embodiment, where the light emitting module is upside down with a light guiding plate positioned on the lower side.

In the light emitting modules 100A, 100B and 100C described in the above embodiments, the light diffusion portion 13 and the wavelength conversion portion 12 which are disposed in the recess 1*b* are layers each having a uniform thickness, and are bonded to each other as layered structure to form the light adjustment portion 10. As shown in FIGS. 22 and 23, the light emitting module may have a shape in which the light adjustment portion 10 partially has one or more irregular surfaces at a boundary between the light diffusion portion 13 and the wavelength conversion portion 12.

In a light emitting module 100D shown in FIG. 22, the light diffusion portion 13 disposed on the bottom of the recess 1*b* has a protrusion 13*a* on a surface facing the wavelength conversion portion 12 side. The light diffusion portion 13 in the drawing has one protrusion 13*a* provided at the central portion of a region facing the light emission surface 11*c* of the light emitting element 11. The protrusion 13*a* shown in the drawing is tapered toward the light emitting element 11 from the surface of the light diffusion portion 13. The protrusion 13*a* may have a conical or pyramidal inverted V-shape as an outline in which the lateral surface is a tapered surface. Alternatively, the protrusion 13*a* may have a curved lateral surface to form a spherical shape or dome shape as an overall shape. Further, the light diffusion portion may be provided with a plurality of protrusions.

The wavelength conversion portion 12 is stacked on and bonded to the surface of the light diffusion portion 13. Therefore, the wavelength conversion portion 12 is provided with a recessed portion 12*a* which has an inner surface outline along the outline of the protrusion 13*a*, with the recessed portion 12*a* facing the protrusion 13*a* of the light diffusion portion 13. Thus, in the light adjustment portion 10 in which the light diffusion portion 13 has the protrusion 13*a*, and the wavelength conversion portion 12 has the recessed portion 12*a*, light enters into the light adjustment portion 10 from the light emitting element 11 is reflected at a boundary surface between the protrusion 13*a* and the recessed portion 12*a*, so that the amount (i.e., efficiency) of light emitted in the lateral direction can be improved. At the same time, the amount (i.e., efficiency) of light emitted to the central portion of the wavelength conversion portion 12 can be reduced.

In the light adjustment portion 10, the size, the shape, the number and so on of protrusions 13*a* provided on the light diffusion portion 13 can be changed so that the amount (i.e., efficiency) of light emitted in the lateral direction and the amount (i.e., efficiency) of light emitted to the central portion of the wavelength conversion portion 12 can be appropriately adjusted. The light adjustment portion 10 may have the protrusion 13*a* in a large size with respect to the light emission surface 11*c* of the light emitting element 11, so that the amount (i.e., efficiency) of light emitted in the lateral direction can be improved, and the amount (i.e., efficiency) of light emitted to the central portion of the wavelength conversion portion 12 can be reduced. In addition, by adjusting the inclination angle and the curvature of the surface of the protrusion 13*a* so as to increase the reflectivity at the surface of the protrusion 13*a*, the amount (i.e., efficiency) of light emitted in the lateral direction can be improved, and the amount (i.e., efficiency) of light emitted to the central portion of the wavelength conversion portion 12 can be reduced.

In a light emitting module 100E shown in FIG. 23, the light diffusion portion 13 disposed on the bottom of the recess 1*b* is provided with a recessed portion 13*b* formed on a surface of the light diffusion portion 13 facing the wavelength conversion portion 12 side. The light diffusion portion 13 in the drawing has one recessed portion 13*b* provided at the central portion of a region facing the light emission surface 11*c* of the light emitting element 11. The recessed portion 13*b* shown in the drawing is tapered toward the bottom of the recess 1*b* from the surface of the light diffusion portion 13. The recessed portion 13*b* may have an inverted-conical or inverted-pyramidal basin shape as an inner surface outline in which the lateral surface is a tapered surface. Alternatively, the recessed portion 13*b* may have a curved lateral surface to form a spherical shape or bowl shape as an overall shape. Further, the light diffusion portion may be provided with a plurality of recessed portions.

The wavelength conversion portion 12 is stacked on and bonded to the surface of the light diffusion portion 13. Therefore, the wavelength conversion portion 12 is provided with a protrusion 12*b* which has an outline along the inner surface outline of the recessed portion 13*b*, with the protrusion 12*b* facing the recessed portion 13*b* of the light diffusion portion 13. Thus, in the light adjustment portion 10 in which the light diffusion portion 13 has the recessed portion 12*b*, and the wavelength conversion portion 12 has the protrusion 12*b*, light enters into the light adjustment portion 10 from the light emitting element 11 is reflected at a boundary surface between the recessed portion 13*b* and the protrusion 12*b*, so that the amount (i.e., efficiency) of light emitted to the central portion of the wavelength conversion portion 12 can be improved. At the same time, the amount (i.e., efficiency) of light emitted in the lateral direction can be reduced.

In the light adjustment portion 10, the size, the shape, the number and so on of recessed portions 13*b* provided on the light diffusion portion 13 can be changed so that the amount (i.e., efficiency) of light emitted to the central portion of the wavelength conversion portion 12 and the amount (i.e., efficiency) of light emitted in the lateral direction can be appropriately adjusted. In the light adjustment portion 10 may have the recessed portion 13*b* in a large size with respect to the light emission surface 11*c* of the light emitting element 11, so that the amount (i.e., efficiency) of light emitted to the central portion of the wavelength conversion portion 12 can be improved, and the amount (i.e., efficiency) of light emitted to the lateral surface can be reduced. In addition, by adjusting the inclination angle and the curvature of the surface of the recessed portion 13*b* so as to increase the reflectivity at the surface of the recessed portion 13*b*, the amount (i.e., efficiency) of light emitted to the central portion of the wavelength conversion portion 12 can be improved, and the amount (i.e., efficiency) of light emitted in the lateral direction can be reduced.

In the light emitting modules 100 of the above embodiments, a plurality of light emitting element units may be connected by wiring so as to be driven independently of one another. The light emitting module may include a plurality of light emitting element unit groups, where the light guiding plate 1 is divided into a plurality of areas, a plurality of light emitting element units mounted within one area is put into one group, and a plurality of light emitting element units in the group is electrically connected to one another in series or in parallel, and connected to the same circuit. By arranging light emitting element units into groups, a light emitting module capable of local dimming can be obtained.

One light emitting module 100 of this embodiment may be used as a backlight for one liquid crystal display device. Alternatively, a plurality of light emitting modules may be arranged, and used as a backlight for one liquid crystal display device. When a plurality of small light emitting modules is provided, and each subjected to inspection or the like, the yield can be improved as compared to a case where the large light emitting module having a large number of light emitting elements mounted thereon is provided.

Figure 24:
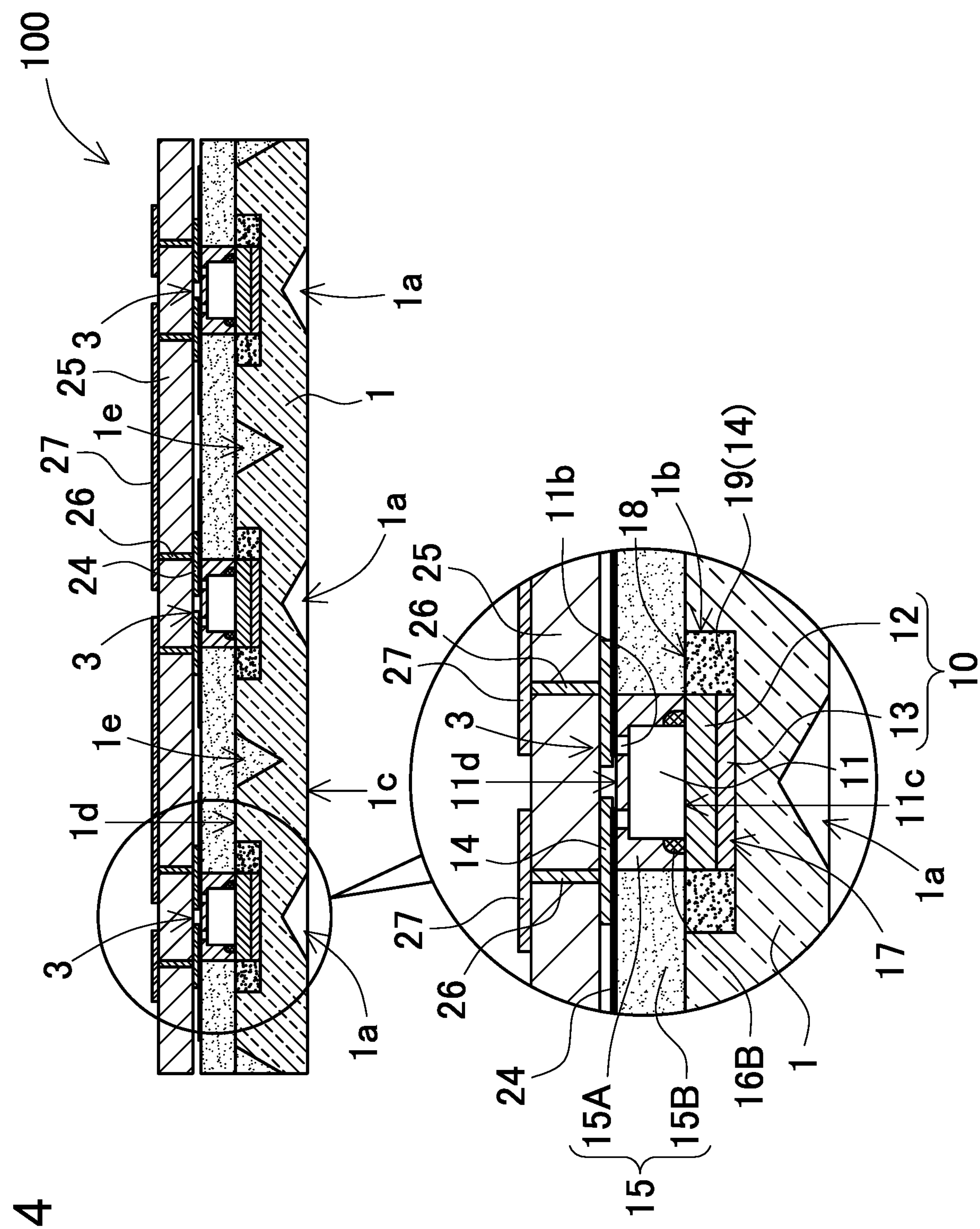
FIG. 24 is an enlarged schematic sectional view showing one example in which a circuit board is connected to the light emitting module shown in FIG. 3.

The light emitting module may include a wiring substrate 25 as shown in FIG. 24. The wiring substrate 25 is provided with, for example, an electrically conductive member 26 covering a plurality of via holes provided on an insulating base member, and a wiring layer 27 electrically connected to the electrically conductive member 26 at both main surfaces of the base member. The electrodes 11*b* are electrically connected to the wiring layer 27 via the electrically conductive member 26.

One light emitting module 100 may be bonded to one wiring substrate. Alternatively, a plurality of light emitting modules 100 may be bonded to one wiring substrate. Accordingly, terminal electrodes for electrical connection to the outside (e.g. connectors) can be integrated, in other words, it is not necessary to prepare terminal electrodes for each light emitting module, and therefore the structure of the liquid crystal display device can be simplified.

Furthermore, a plurality of wiring substrates, each of which is bonded to a plurality of light emitting modules 100, may be arranged, and used as a backlight for one liquid crystal display device. In this case, for example, a plurality of wiring substrates can be placed on a frame or the like, and each connected to an external power source using a connector or the like.

A light-transmissive member having a function of light diffusion or the like may be further stacked on the light guiding plate 1. In this case, when the optically functional portion 1*a* is a hollow, the opening (i.e., a portion close to the first main surface 1*c* of the light guiding plate 1) of the hollow is closed, or a light-transmissive member is provided without filling the hollow. Accordingly, a layer of air can be provided in the hollow of the optically functional portion 1*a*, so that light from the light emitting element 11 can be favorably spread.

The light emitting module according to the present disclosure can be used as, for example, a backlight for a liquid crystal display device, lighting equipment or the like.

What is claimed is:

1. A light emitting module comprising:

a light-transmissive light guiding plate having a first main surface serving as a light emitting surface which emits light outside, and a second main surface opposite to the first main surface, the second main surface being provided with a recess;

a light adjustment portion disposed in the recess of the light guiding plate;

a light emitting element bonded to the light adjustment portion;

a light emitting element unit comprising the light emitting element and the light adjustment portion, wherein the light adjustment portion comprises a wavelength conversion portion and a light diffusion portion having a wavelength conversion portion side on which the wavelength conversion portion is bonded, wherein the light diffusion portion is disposed on a bottom of the recess, wherein the wavelength conversion portion is bonded to the light emitting element, wherein the wavelength conversion portion and the light diffusion portion are stacked, and the light emitting element is attached to the light adjustment portion, wherein the light emitting element unit comprises a first encapsulating resin which has outer lateral surfaces, and wherein the outer lateral surfaces of the first encapsulating resin is substantially coplanar with outer lateral surfaces of the light adjustment portion or the wavelength conversion portion.

2. The light emitting module according to claim 1,
wherein the light adjustment portion is positioned in the recess, and
wherein the light emitting element is positioned outside the recess.

3. The light emitting module according to claim 1, wherein the light diffusion portion comprises a protrusion on the wavelength conversion portion side.

4. The light emitting module according to claim 1, further comprising,
an encapsulating resin embedding the light emitting element, the encapsulating resin being stacked on the second main surface of the light guiding plate.

5. The light emitting module according to claim 1, further comprising
a second encapsulating resin embedding the light emitting element unit, the second encapsulating resin being stacked on the second main surface of the light guiding plate.

6. The light emitting module according to claim 5, wherein the light emitting element unit embedded in the first encapsulating resin is embedded in the second encapsulating resin.

7. The light emitting module according to claim 1, wherein at least one of the first encapsulating resin and the second encapsulating resin comprise a white resin.

8. The light emitting module according to claim 1, wherein both the first encapsulating resin and the second encapsulating resin comprise a white resin.

9. The light emitting module according to claim 1,
wherein the light emitting element comprises:
a light emission surface; and
an electrode-formed surface opposite to the light emission surface, and
wherein the light adjustment portion is bonded to the light emission surface.

10. The light emitting module according to claim 1,
wherein the light-transmissive light guiding plate comprises an optically functional portion on the first main surface side.

11. The light emitting module according to claim 1,
wherein the light emitting element unit further comprises an insertion portion disposed in the recess, and
wherein an inner surface outline of the recess has a quadrangular shape, and an outline of the insertion portion in the recess has a quadrangular shape.

12. The light emitting module according to claim 1, further comprising a bonding wall located in a ring gap formed between the light adjustment portion and the recess.

13. The light emitting module according to claim 12, wherein the bonding wall is made of a light-transmissive bonding agent.

14. The light emitting module according to claim 12, wherein a volumetric capacity of the ring gap is larger than a volume of the light adjustment portion of the light emitting element unit.

* * * * *